(12) United States Patent
DeMuth et al.

(10) Patent No.: US 11,911,964 B2
(45) Date of Patent: *Feb. 27, 2024

(54) RECYCLING POWDERED MATERIAL FOR ADDITIVE MANUFACTURING

(71) Applicant: Seurat Technologies, Inc., Mountain View, CA (US)

(72) Inventors: James A. DeMuth, Woburn, MA (US); Erik Toomre, Los Altos, CA (US); Francis L. Leard, Sudbury, MA (US); Kourosh Kamshad, Hudson, NH (US); Heiner Fees, Bietigheim-Bissingen (DE); Eugene Berdichevsky, Oakland, CA (US)

(73) Assignee: Seurat Technologies, Inc., Wilmington, MA (US)

( * ) Notice: Subject to any disclaimer, the term of this patent is extended or adjusted under 35 U.S.C. 154(b) by 442 days.

This patent is subject to a terminal disclaimer.

(21) Appl. No.: 15/337,779

(22) Filed: Oct. 28, 2016

(65) Prior Publication Data

US 2017/0120538 A1 May 4, 2017

Related U.S. Application Data

(60) Provisional application No. 62/248,795, filed on Oct. 30, 2015, provisional application No. 62/248,791, (Continued)

(51) Int. Cl.
*B29C 64/264* (2017.01)
*B29C 64/153* (2017.01)
(Continued)

(52) U.S. Cl.
CPC .............. *B29C 64/264* (2017.08); *B22F 3/24* (2013.01); *B22F 10/00* (2021.01); *B22F 10/28* (2021.01);
(Continued)

(58) Field of Classification Search
CPC ...... B22F 2003/1059; B22F 2009/0832; B22F 3/1055; B23K 26/1224; B23K 15/06
See application file for complete search history.

(56) References Cited

U.S. PATENT DOCUMENTS

| | | |
|---|---|---|
| 4,247,508 A | 1/1981 | Housholder |
| 4,944,817 A | 7/1990 | Bourell |

(Continued)

FOREIGN PATENT DOCUMENTS

| | | |
|---|---|---|
| CN | 1593817 A | 3/2005 |
| DE | 102007014968 | 10/2008 |

(Continued)

*Primary Examiner* — Michael M. Robinson
(74) *Attorney, Agent, or Firm* — David R. Stevens; Stevens Law Group

(57) ABSTRACT

A method and an apparatus for collecting a powdered material after a print job in powder bed fusion additive manufacturing may involve a build platform supporting a powder bed capable of tilting, inverting, and shaking to separate the powder bed substantially from the build platform in a hopper. The powdered material may be collected in a hopper for reuse in later print jobs. The powder collecting process may be automated to increase efficiency of powder bed fusion additive manufacturing.

6 Claims, 13 Drawing Sheets

Related U.S. Application Data filed on Oct. 30, 2015, provisional application No. 62/248,989, filed on Oct. 30, 2015, provisional application No. 62/248,968, filed on Oct. 30, 2015, provisional application No. 62/248,770, filed on Oct. 30, 2015, provisional application No. 62/248,980, filed on Oct. 30, 2015, provisional application No. 62/248,835, filed on Oct. 30, 2015, provisional application No. 62/248,758, filed on Oct. 30, 2015, provisional application No. 62/248,839, filed on Oct. 30, 2015, provisional application No. 62/248,966, filed on Oct. 30, 2015, provisional application No. 62/248,833, filed on Oct. 30, 2015, provisional application No. 62/248,829, filed on Oct. 30, 2015, provisional application No. 62/248,765, filed on Oct. 30, 2015, provisional application No. 62/248,821, filed on Oct. 30, 2015, provisional application No. 62/248,841, filed on Oct. 30, 2015, provisional application No. 62/248,847, filed on Oct. 30, 2015, provisional application No. 62/248,780, filed on Oct. 30, 2015, provisional application No. 62/248,783, filed on Oct. 30, 2015, provisional application No. 62/248,776, filed on Oct. 30, 2015, provisional application No. 62/248,969, filed on Oct. 30, 2015, provisional application No. 62/248,787, filed on Oct. 30, 2015, provisional application No. 62/248,848, filed on Oct. 30, 2015, provisional application No. 62/248,799, filed on Oct. 30, 2015.

(51) Int. Cl.

| | |
|---|---|
| *B33Y 10/00* | (2015.01) |
| *B33Y 40/00* | (2020.01) |
| *B33Y 50/02* | (2015.01) |
| *B33Y 70/00* | (2020.01) |
| *B33Y 80/00* | (2015.01) |
| *B33Y 99/00* | (2015.01) |
| *B23K 26/12* | (2014.01) |
| *B23K 26/142* | (2014.01) |
| *B23K 26/144* | (2014.01) |
| *B23K 26/70* | (2014.01) |
| *B29C 64/386* | (2017.01) |
| *B29C 64/268* | (2017.01) |
| *B22F 3/24* | (2006.01) |
| *B23K 15/00* | (2006.01) |
| *B23K 15/06* | (2006.01) |
| *B23K 26/03* | (2006.01) |
| *B23K 26/08* | (2014.01) |
| *B23K 26/16* | (2006.01) |
| *B23K 26/36* | (2014.01) |
| *B23K 37/04* | (2006.01) |
| *B25J 11/00* | (2006.01) |
| *G02B 7/14* | (2021.01) |
| *G02B 7/16* | (2021.01) |
| *G02B 7/182* | (2021.01) |
| *G02B 15/04* | (2006.01) |
| *G02B 15/10* | (2006.01) |
| *G02B 19/00* | (2006.01) |
| *G02F 1/01* | (2006.01) |
| *G02F 1/1333* | (2006.01) |
| *G02F 1/135* | (2006.01) |
| *G05B 17/02* | (2006.01) |
| *H01S 5/40* | (2006.01) |
| *B22F 10/00* | (2021.01) |
| *H01S 5/00* | (2006.01) |
| *B22F 12/33* | (2021.01) |
| *B22F 12/44* | (2021.01) |
| *B22F 12/70* | (2021.01) |
| *B22F 12/00* | (2021.01) |
| *G02B 27/10* | (2006.01) |
| *B22F 10/28* | (2021.01) |
| *B22F 10/70* | (2021.01) |
| *B22F 12/30* | (2021.01) |
| *B22F 12/88* | (2021.01) |
| *B22F 12/90* | (2021.01) |
| *B22F 10/34* | (2021.01) |
| *B22F 10/36* | (2021.01) |
| *G02B 26/08* | (2006.01) |
| *B23K 26/00* | (2014.01) |
| *B23K 26/082* | (2014.01) |
| *B23K 101/00* | (2006.01) |
| *B23K 101/24* | (2006.01) |
| *B23K 103/00* | (2006.01) |
| *B23K 101/02* | (2006.01) |
| *B29K 105/00* | (2006.01) |
| *G02B 27/28* | (2006.01) |
| *G07C 3/14* | (2006.01) |
| *B22F 10/73* | (2021.01) |
| *B22F 12/17* | (2021.01) |
| *B22F 12/20* | (2021.01) |
| *B22F 12/41* | (2021.01) |
| *B22F 12/45* | (2021.01) |
| *B22F 12/53* | (2021.01) |
| *B22F 10/47* | (2021.01) |
| *B22F 10/32* | (2021.01) |
| *B22F 10/50* | (2021.01) |
| *B22F 10/64* | (2021.01) |
| *B22F 10/10* | (2021.01) |
| *B33Y 30/00* | (2015.01) |
| *B23K 26/342* | (2014.01) |
| *B28B 1/00* | (2006.01) |
| *G02B 27/09* | (2006.01) |
| *G02B 27/14* | (2006.01) |
| *G02B 27/00* | (2006.01) |

(52) U.S. Cl.
CPC ............ *B22F 10/34* (2021.01); *B22F 10/36* (2021.01); *B22F 10/70* (2021.01); *B22F 12/00* (2021.01); *B22F 12/226* (2021.01); *B22F 12/30* (2021.01); *B22F 12/33* (2021.01); *B22F 12/38* (2021.01); *B22F 12/44* (2021.01); *B22F 12/70* (2021.01); *B22F 12/88* (2021.01); *B22F 12/90* (2021.01); *B23K 15/002* (2013.01); *B23K 15/0006* (2013.01); *B23K 15/0013* (2013.01); *B23K 15/0026* (2013.01); *B23K 15/0093* (2013.01); *B23K 15/06* (2013.01); *B23K 26/03* (2013.01); *B23K 26/032* (2013.01); *B23K 26/083* (2013.01); *B23K 26/0846* (2013.01); *B23K 26/123* (2013.01); *B23K 26/127* (2013.01); *B23K 26/1224* (2015.10); *B23K 26/142* (2015.10); *B23K 26/144* (2015.10); *B23K 26/16* (2013.01); *B23K 26/36* (2013.01); *B23K 26/702* (2015.10); *B23K 26/703* (2015.10); *B23K 26/704* (2015.10); *B23K 37/0426* (2013.01); *B25J 11/00* (2013.01); *B29C 64/153* (2017.08); *B29C 64/268* (2017.08); *B29C 64/386* (2017.08); *B33Y 10/00* (2014.12); *B33Y 40/00* (2014.12); *B33Y 50/02* (2014.12); *B33Y 70/00* (2014.12); *B33Y 80/00* (2014.12); *B33Y 99/00* (2014.12); *G02B 7/14* (2013.01); *G02B 7/16* (2013.01); *G02B 7/1827*

(2013.01); *G02B 15/04* (2013.01); *G02B 15/10* (2013.01); *G02B 19/0028* (2013.01); *G02B 19/0047* (2013.01); *G02B 26/0816* (2013.01); *G02B 27/108* (2013.01); *G02F 1/0136* (2013.01); *G02F 1/135* (2013.01); *G02F 1/133362* (2013.01); *G05B 17/02* (2013.01); *H01S 5/005* (2013.01); *H01S 5/4012* (2013.01); *B22F 10/10* (2021.01); *B22F 10/32* (2021.01); *B22F 10/47* (2021.01); *B22F 10/50* (2021.01); *B22F 10/64* (2021.01); *B22F 10/73* (2021.01); *B22F 12/17* (2021.01); *B22F 12/20* (2021.01); *B22F 12/222* (2021.01); *B22F 12/41* (2021.01); *B22F 12/45* (2021.01); *B22F 12/53* (2021.01); *B22F 2003/247* (2013.01); *B22F 2003/248* (2013.01); *B22F 2998/10* (2013.01); *B22F 2999/00* (2013.01); *B23K 15/0086* (2013.01); *B23K 26/0006* (2013.01); *B23K 26/082* (2015.10); *B23K 26/342* (2015.10); *B23K 37/0408* (2013.01); *B23K 2101/001* (2018.08); *B23K 2101/008* (2018.08); *B23K 2101/02* (2018.08); *B23K 2101/24* (2018.08); *B23K 2103/00* (2018.08); *B23K 2103/42* (2018.08); *B23K 2103/50* (2018.08); *B28B 1/001* (2013.01); *B29K 2105/251* (2013.01); *B33Y 30/00* (2014.12); *G02B 27/0068* (2013.01); *G02B 27/0905* (2013.01); *G02B 27/141* (2013.01); *G02B 27/283* (2013.01); *G02B 27/286* (2013.01); *G05B 2219/49023* (2013.01); *G07C 3/146* (2013.01); *Y02P 10/25* (2015.11); *Y02P 80/40* (2015.11)

(56) References Cited

U.S. PATENT DOCUMENTS

| | | | |
|---|---|---|---|
| 5,155,324 | A | 10/1992 | Deckard |
| 5,236,637 | A | 8/1993 | Hull |
| 5,314,003 | A | 5/1994 | Mackay |
| 5,382,308 | A | 1/1995 | Bourell |
| 5,508,489 | A | 4/1996 | Benda |
| 5,640,667 | A | 6/1997 | Freitag |
| 5,674,414 | A | 10/1997 | Schweizer |
| 5,837,960 | A | 11/1998 | Lewis |
| 6,005,717 | A | 12/1999 | Neuberger |
| 6,375,874 | B1 | 4/2002 | Russell |
| 6,405,095 | B1 | 6/2002 | Jang |
| 6,462,306 | B1 | 10/2002 | Kitai |
| 6,560,001 | B1 | 5/2003 | Igasaki |
| 6,641,778 | B2 | 11/2003 | Mcgregor |
| 6,676,892 | B2 | 1/2004 | Das |
| 6,717,106 | B2 | 4/2004 | Nagano |
| 7,088,432 | B2 | 8/2006 | Zhang |
| 7,444,046 | B2 | 10/2008 | Karlsen |
| 7,509,738 | B2 | 3/2009 | Adams |
| 7,569,174 | B2 | 8/2009 | Ruatta |
| 7,686,995 | B2 | 3/2010 | Davidson |
| 7,713,048 | B2 | 5/2010 | Perret |
| 7,820,241 | B2 | 10/2010 | Perret |
| 7,887,316 | B2 | 2/2011 | Cox |
| 7,971,991 | B2 | 7/2011 | Davidson |
| 7,979,152 | B2 | 7/2011 | Davidson |
| 8,199,787 | B2 | 6/2012 | Deri |
| 8,514,475 | B2 | 8/2013 | Deri |
| 8,525,943 | B2 | 9/2013 | Burgess |
| 8,568,646 | B2 | 10/2013 | Wang |
| 8,666,142 | B2 | 3/2014 | Shkolnik |
| 8,784,720 | B2 | 7/2014 | Oberhofer |
| 8,801,418 | B2 | 8/2014 | El-siblani |
| 8,815,143 | B2 | 8/2014 | John |
| 8,827,681 | B2 | 9/2014 | Chen |
| 8,902,497 | B2 | 12/2014 | Erlandson |
| 8,982,313 | B2 | 3/2015 | Escuti |
| 9,114,478 | B2 | 8/2015 | Scott |
| 9,136,668 | B2 | 9/2015 | Bayramian |
| 9,172,208 | B1 | 10/2015 | Dawson |
| 9,186,847 | B2 | 11/2015 | Fruth |
| 9,192,056 | B2 | 11/2015 | Rubenchik |
| 9,283,593 | B2 | 3/2016 | Bruck |
| 9,308,583 | B2 | 4/2016 | El-dasher |
| 9,331,452 | B2 | 5/2016 | Bayramian |
| 9,364,897 | B2 | 6/2016 | O'neill |
| 9,522,426 | B2 | 12/2016 | Das |
| 9,573,193 | B2 | 2/2017 | Buller |
| 9,586,365 | B2 | 3/2017 | Chen |
| 9,682,397 | B2 | 6/2017 | Jakimov |
| 9,688,020 | B2 | 6/2017 | Teken |
| 9,815,139 | B2 | 11/2017 | Bruck |
| 9,855,625 | B2 | 1/2018 | El-dasher |
| 9,962,767 | B2 | 5/2018 | Buller |
| 10,166,751 | B2 | 1/2019 | Kramer |
| 10,195,692 | B2 | 2/2019 | Rockstroh |
| 10,195,693 | B2 | 2/2019 | Buller |
| 10,245,784 | B2 | 4/2019 | Teken |
| 10,279,598 | B2 | 5/2019 | Deppe |
| 10,328,685 | B2 | 6/2019 | Jones |
| 10,335,901 | B2 | 7/2019 | Ferrar |
| 2002/0015654 | A1 | 2/2002 | Das |
| 2002/0090313 | A1 | 7/2002 | Wang |
| 2002/0090410 | A1 | 7/2002 | Tochimoto |
| 2002/0149137 | A1 | 10/2002 | Jang |
| 2003/0052105 | A1 | 3/2003 | Nagano |
| 2004/0084814 | A1 | 5/2004 | Boyd |
| 2005/0083498 | A1 | 4/2005 | Jeng |
| 2006/0214335 | A1* | 9/2006 | Cox ............... B01F 3/188 264/497 |
| 2007/0122560 | A1 | 5/2007 | Adams |
| 2007/0179655 | A1* | 8/2007 | Farnworth ............ B33Y 30/00 700/114 |
| 2008/0211132 | A1 | 9/2008 | Feenstra |
| 2008/0241404 | A1 | 10/2008 | Allaman |
| 2008/0262659 | A1 | 10/2008 | Huskamp |
| 2009/0020901 | A1 | 1/2009 | Schillen |
| 2009/0206065 | A1 | 8/2009 | Kruth |
| 2009/0221422 | A1 | 9/2009 | Miller |
| 2010/0089881 | A1 | 4/2010 | Bruland |
| 2010/0176539 | A1 | 7/2010 | Higashi |
| 2010/0192806 | A1 | 8/2010 | Heugel |
| 2011/0019705 | A1 | 1/2011 | Adams |
| 2011/0033887 | A1 | 2/2011 | Fang |
| 2011/0190904 | A1* | 8/2011 | Lechmann ........ A61B 17/7208 623/23.61 |
| 2011/0233808 | A1 | 9/2011 | Davidson |
| 2011/0278269 | A1 | 11/2011 | Gold |
| 2012/0039565 | A1 | 2/2012 | Klein |
| 2013/0052291 | A1 | 2/2013 | Morikawa |
| 2013/0102447 | A1 | 4/2013 | Strong |
| 2013/0112672 | A1 | 5/2013 | Keremes |
| 2013/0136868 | A1 | 5/2013 | Bruck |
| 2013/0270750 | A1 | 10/2013 | Green |
| 2013/0271800 | A1 | 10/2013 | Kanugo |
| 2013/0300286 | A1 | 11/2013 | Ljungblad |
| 2013/0302533 | A1 | 11/2013 | Bruck |
| 2014/0085631 | A1 | 3/2014 | Lacour |
| 2014/0154088 | A1 | 6/2014 | Etter |
| 2014/0158667 | A1 | 6/2014 | Stecker et al. |
| 2014/0203479 | A1 | 7/2014 | Teken |
| 2014/0252687 | A1 | 9/2014 | El-dasher |
| 2014/0263209 | A1 | 9/2014 | Burris |
| 2014/0271965 | A1 | 9/2014 | Ferrar |
| 2014/0367894 | A1 | 12/2014 | Kramer |
| 2015/0034123 | A1* | 2/2015 | Pressacco ............ B08B 5/02 134/10 |
| 2015/0125335 | A1 | 5/2015 | Bruck |
| 2015/0132173 | A1 | 5/2015 | Bruck |
| 2015/0137426 | A1 | 5/2015 | Van Esbroeck et al. |
| 2015/0165556 | A1 | 6/2015 | Jones |
| 2015/0183166 | A1* | 7/2015 | Yoo ............... B33Y 10/00 264/128 |
| 2015/0211083 | A1 | 7/2015 | Gabilondo |
| 2015/0273632 | A1 | 10/2015 | Chen |

(56) References Cited

U.S. PATENT DOCUMENTS

| | | |
|---|---|---|
| 2015/0283612 A1 | 10/2015 | Maeda |
| 2015/0283614 A1 | 10/2015 | Wu |
| 2015/0311064 A1 | 10/2015 | Stuart |
| 2015/0343664 A1 | 12/2015 | Liu |
| 2015/0360418 A1 | 12/2015 | Shah |
| 2015/0375456 A1 | 12/2015 | Cheverton |
| 2016/0067923 A1 | 3/2016 | James |
| 2016/0082662 A1 | 3/2016 | Majer |
| 2016/0114432 A1 | 4/2016 | Ferrar |
| 2016/0175935 A1 | 6/2016 | Ladewig |
| 2016/0193696 A1* | 7/2016 | McFarland ............ B22F 3/1055 219/76.12 |
| 2016/0236279 A1 | 8/2016 | Ashton |
| 2016/0236422 A1* | 8/2016 | Sakura .................... B29C 64/35 |
| 2016/0243652 A1 | 8/2016 | El-dasher |
| 2016/0279707 A1 | 9/2016 | Mattes |
| 2016/0318253 A1* | 11/2016 | Barnhart ............... B22F 3/1055 |
| 2016/0322777 A1 | 11/2016 | Zediker |
| 2017/0014904 A1* | 1/2017 | Brown .................. B29C 64/153 |
| 2017/0050386 A1* | 2/2017 | Houben ................ B29C 64/153 |
| 2018/0021978 A1 | 1/2018 | Todorov |

FOREIGN PATENT DOCUMENTS

| | | |
|---|---|---|
| DE | 10 2010034311 A1 | 2/2012 |
| DE | 102013205029 A1 | 9/2014 |
| EP | 0402944 A2 | 12/1990 |
| EP | 1700686 A2 | 9/2006 |
| EP | 2674283 A2 | 12/2013 |
| EP | 2832528 A1 | 4/2015 |
| EP | 2875897 A1 | 5/2015 |
| EP | 2926979 A1 | 10/2015 |
| EP | 2964418 B1 | 5/2019 |
| EP | 2992942 B1 | 6/2019 |
| GB | 2453945 A | 4/2009 |
| JP | 2002-205338 | 7/2002 |
| JP | 5933512 B2 | 6/2016 |
| WO | WO/2010/083997 A2 | 7/2010 |
| WO | WO/2012/151262 A2 | 11/2012 |
| WO | WO/2014/167100 A1 | 10/2014 |
| WO | WO/2014/199134 A1 | 12/2014 |
| WO | WO/2014/199149 A1 | 12/2014 |
| WO | WO/2014/074954 A3 | 1/2015 |
| WO | WO/2015/003804 A1 | 1/2015 |
| WO | WO/2015/017077 A1 | 2/2015 |
| WO | WO 2015025171 A2 | 2/2015 |
| WO | 2015/075539 | 5/2015 |
| WO | WO/2015/075539 A1 | 5/2015 |
| WO | WO2015094720 A1 | 6/2015 |
| WO | WO/2015/108991 A2 | 7/2015 |
| WO | WO2015112723 A1 | 7/2015 |
| WO | WO/2015/120168 A1 | 8/2015 |
| WO | WO/2015/191257 A1 | 12/2015 |
| WO | WO/2015/134075 A3 | 1/2016 |
| WO | WO/2016/071265 A1 | 5/2016 |
| WO | WO/2016/079496 A3 | 6/2016 |
| WO | WO/2016/110440 A1 | 7/2016 |
| WO | WO/2016/201309 A1 | 12/2016 |
| WO | WO/2018/075087 A1 | 4/2018 |
| WO | WO/2018/087218 A1 | 5/2018 |

* cited by examiner

RECYCLING POWDERED MATERIAL FOR ADDITIVE MANUFACTURING

CROSS REFERENCE TO RELATED PATENT APPLICATION

The present disclosure is part of a non-provisional patent application claiming the priority benefit of
U.S. Patent Application No. 62/248,758, filed on Oct. 30, 2015,
U.S. Patent Application No. 62/248,765, filed on Oct. 30, 2015,
U.S. Patent Application No. 62/248,770, filed on Oct. 30, 2015,
U.S. Patent Application No. 62/248,776, filed on Oct. 30, 2015,
U.S. Patent Application No. 62/248,783, filed on Oct. 30, 2015,
U.S. Patent Application No. 62/248,791, filed on Oct. 30, 2015,
U.S. Patent Application No. 62/248,799, filed on Oct. 30, 2015,
U.S. Patent Application No. 62/248,966, filed on Oct. 30, 2015,
U.S. Patent Application No. 62/248,968, filed on Oct. 30, 2015,
U.S. Patent Application No. 62/248,969, filed on Oct. 30, 2015,
U.S. Patent Application No. 62/248,980, filed on Oct. 30, 2015,
U.S. Patent Application No. 62/248,989, filed on Oct. 30, 2015,
U.S. Patent Application No. 62/248,780, filed on Oct. 30, 2015,
U.S. Patent Application No. 62/248,787, filed on Oct. 30, 2015,
U.S. Patent Application No. 62/248,795, filed on Oct. 30, 2015,
U.S. Patent Application No. 62/248,821, filed on Oct. 30, 2015,
U.S. Patent Application No. 62/248,829, filed on Oct. 30, 2015,
U.S. Patent Application No. 62/248,833, filed on Oct. 30, 2015,
U.S. Patent Application No. 62/248,835, filed on Oct. 30, 2015,
U.S. Patent Application No. 62/248,839, filed on Oct. 30, 2015,
U.S. Patent Application No. 62/248,841, filed on Oct. 30, 2015,
U.S. Patent Application No. 62/248,847, filed on Oct. 30, 2015, and
U.S. Patent Application No. 62/248,848, filed on Oct. 30, 2015, which are incorporated by reference in its entirety.

TECHNICAL FIELD

The present disclosure generally relates to three-dimensional (3D) powder bed fusion additive manufacturing and, more particularly, to automatic collection of a powdered material for reuse after a print cycle.

BACKGROUND

Powder removal and collection for powder bed fusion type additive manufacturing machines is required after each print cycle, or to restart a print that has already begun. This process may be performed either by manual brushing or gas-spraying of the build platform to dislodge and remove powders, which may increase delay and reduce efficiency. The printed object and powder separation activities may need to be in a closed environment with inert gases for multiple reasons: (1) to keep reactive powders from possible combustion, (2) to avoid contamination of printed object or powders that may be recycled in a later print, and (3) to avoid oxide/nitride/hydroxide compounds from forming during high temperature melting operations as part of the additive manufacturing process. Powder removal may be difficult for a large printed object due to the size and weight. The print bed containing both a printed object and powders may weigh thousands of kilograms or more and may be difficult to handle. An efficient powder recycling process is thus very much needed.

BRIEF DESCRIPTION OF THE DRAWINGS

Non-limiting and non-exhaustive embodiments of the present disclosure are described with reference to the following figures, wherein like reference numerals refer to like parts throughout the various figures unless otherwise specified

DETAILED DESCRIPTION

Figure 1A:
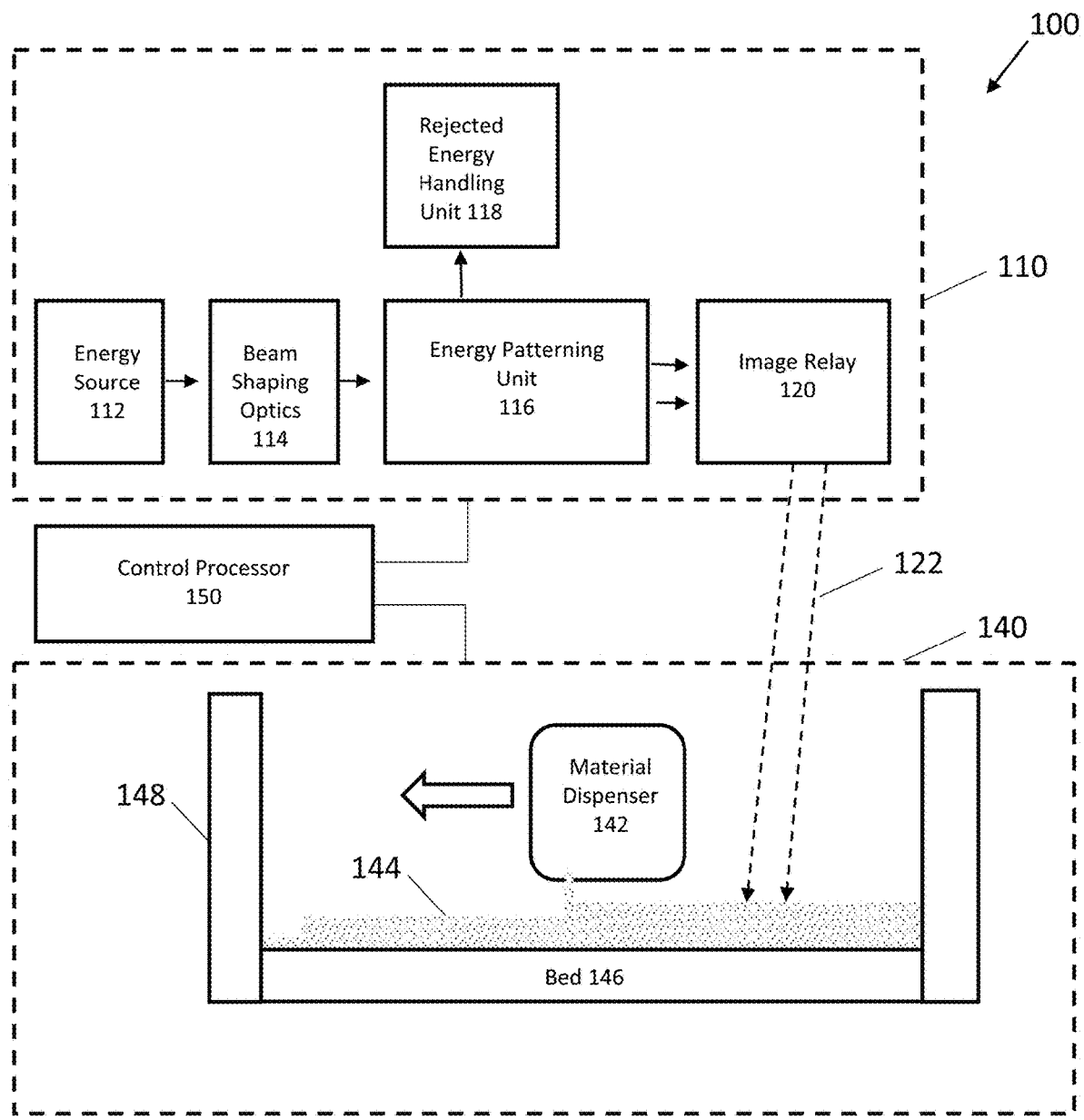
FIG. 1A illustrates an additive manufacturing system.

In the following description, reference is made to the accompanying drawings that form a part thereof, and in which is shown by way of illustrating specific exemplary embodiments in which the disclosure may be practiced. These embodiments are described in sufficient detail to enable those skilled in the art to practice the concepts disclosed herein, and it is to be understood that modifications to the various disclosed embodiments may be made, and other embodiments may be utilized, without departing from the scope of the present disclosure. The following detailed description is, therefore, not to be taken in a limiting sense.

The present disclosure describes a method and an apparatus of powder bed fusion additive manufacturing for automatically collecting powdered materials for reuse after a print cycle.

In various embodiments in accordance with the present disclosure, a build platform capable of moving, tilting, or inverting is designed for separating a powder bed from the supporting build platform. The powder bed is formed by dispensing multiple layers of a powdered material during an additive manufacturing print cycle for a 3D object. A substantial portion of the powdered material is collected in a hopper and transported to a storage chamber for reuse in later print jobs. The powdered material may be sealed inside the storage chamber in a controlled atmosphere such as air, nitrogen, argon, helium, or other inert or noble gas.

In powder bed fusion additive manufacturing, a powder bed may be formed by successively dispensing multiple layers of a powdered material on a build platform. An optical or electron beam of sufficient energy impinges on the surface of powder bed and may cause melting/sintering/amalgamating or processing of the powdered material to form integral object(s). When the portion of a powder layer corresponding to the geometry of a two-dimensional slice of a 3D object is fused or bonded together, a next layer of the powdered material is dispensed on the surface of the powder bed to continue the print cycle. The printed objects and remaining powdered material need to be removed from the build platform when the printing job is finished to allow a next cycle to begin.

An additive manufacturing system is disclosed which has one or more energy sources, including in one embodiment, one or more laser or electron beams, positioned to emit one or more energy beams. Beam shaping optics may receive the one or more energy beams from the energy source and form a single beam. An energy patterning unit receives or generates the single beam and transfers a two-dimensional pattern to the beam, and may reject the unused energy not in the pattern. An image relay receives the two-dimensional patterned beam and focuses it as a two-dimensional image to a desired location on a height fixed or movable build platform (e.g. a powder bed). In certain embodiments, some or all of any rejected energy from the energy patterning unit is reused.

In some embodiments, multiple beams from the laser array(s) are combined using a beam homogenizer. This combined beam can be directed at an energy patterning unit that includes either a transmissive or reflective pixel addressable light valve. In one embodiment, the pixel addressable light valve includes both a liquid crystal module having a polarizing element and a light projection unit providing a two-dimensional input pattern. The two-dimensional image focused by the image relay can be sequentially directed toward multiple locations on a powder bed to build a 3D structure.

As seen in FIG. 1, an additive manufacturing system 100 has an energy patterning system 110 with an energy source 112 that can direct one or more continuous or intermittent energy beam(s) toward beam shaping optics 114. After shaping, if necessary, the beam is patterned by an energy patterning unit 116, with generally some energy being directed to a rejected energy handling unit 118. Patterned energy is relayed by image relay 120 toward an article processing unit 140, typically as a two-dimensional image 122 focused near a bed 146. The bed 146 (with optional walls 148) can form a chamber containing material 144 dispensed by material dispenser 142. Patterned energy, directed by the image relay 120, can melt, fuse, sinter, amalgamate, change crystal structure, influence stress patterns, or otherwise chemically or physically modify the dispensed material 144 to form structures with desired properties.

Energy source 112 generates photon (light), electron, ion, or other suitable energy beams or fluxes capable of being directed, shaped, and patterned. Multiple energy sources can be used in combination. The energy source 112 can include lasers, incandescent light, concentrated solar, other light sources, electron beams, or ion beams. Possible laser types include, but are not limited to: Gas Lasers, Chemical Lasers, Dye Lasers, Metal Vapor Lasers, Solid State Lasers (e.g. fiber), Semiconductor (e.g. diode) Lasers, Free electron laser, Gas dynamic laser, "Nickel-like" Samarium laser, Raman laser, or Nuclear pumped laser.

A Gas Laser can include lasers such as a Helium-neon laser, Argon laser, Krypton laser, Xenon ion laser, Nitrogen laser, Carbon dioxide laser, Carbon monoxide laser or Excimer laser.

A Chemical laser can include lasers such as a Hydrogen fluoride laser, Deuterium fluoride laser, COIL (Chemical oxygen-iodine laser), or Agil (All gas-phase iodine laser).

A Metal Vapor Laser can include lasers such as a Helium-cadmium (HeCd) metal-vapor laser, Helium-mercury (HeHg) metal-vapor laser, Helium-selenium (HeSe) metal-vapor laser, Helium-silver (HeAg) metal-vapor laser, Strontium Vapor Laser, Neon-copper (NeCu) metal-vapor laser, Copper vapor laser, Gold vapor laser, or Manganese (Mn/MnCl$_2$) vapor laser.

A Solid State Laser can include lasers such as a Ruby laser, Nd:YAG laser, NdCrYAG laser, Er:YAG laser, Neodymium YLF (Nd:YLF) solid-state laser, Neodymium doped Yttrium orthovanadate (Nd:YVO$_4$) laser, Neodymium doped yttrium calcium oxoborateNd:YCa$_4$O(BO$_3$)$^3$ or simply Nd:YCOB, Neodymium glass (Nd:Glass) laser, Titanium sapphire (Ti:sapphire) laser, Thulium YAG (Tm:YAG) laser, Ytterbium YAG (Yb:YAG) laser, Ytterbium:2O$_3$ (glass or ceramics) laser, Ytterbium doped glass laser (rod, plate/chip, and fiber), Holmium YAG (Ho:YAG) laser, Chromium ZnSe (Cr:ZnSe) laser, Cerium doped lithium strontium (or calcium)aluminum fluoride (Ce:LiSAF, Ce:LiCAF), Promethium 147 doped phosphate glass (147Pm$^{+3}$:Glass) solid-state laser, Chromium doped chrysoberyl (alexandrite) laser, Erbium doped anderbium-ytterbium co-doped glass lasers, Trivalent uranium doped calcium fluoride (U:CaF$_2$) solid-state laser, Divalent samarium doped calcium fluoride (Sm:CaF$_2$) laser, or F-Center laser.

A Semiconductor Laser can include laser medium types such as GaN, InGaN, AlGaInP, AlGaAs, InGaAsP, GaInP, InGaAs, InGaAsO, GaInAsSb, lead salt, Vertical cavity surface emitting laser (VCSEL), Quantum cascade laser, Hybrid silicon laser, or combinations thereof.

For example, in one embodiment a single Nd:YAG q-switched laser can be used in conjunction with multiple semiconductor lasers. In another embodiment, an electron beam can be used in conjunction with an ultraviolet semiconductor laser array. In still other embodiments, a two-dimensional array of lasers can be used. In some embodiments with multiple energy sources, pre-patterning of an energy beam can be done by selectively activating and deactivating energy sources.

Beam shaping unit 114 can include a great variety of imaging optics to combine, focus, diverge, reflect, refract, homogenize, adjust intensity, adjust frequency, or otherwise shape and direct one or more energy beams received from the energy source 112 toward the energy patterning unit 116. In one embodiment, multiple light beams, each having a distinct light wavelength, can be combined using wavelength selective mirrors (e.g. dichroics) or diffractive elements. In other embodiments, multiple beams can be homogenized or combined using multifaceted mirrors, microlenses, and refractive or diffractive optical elements.

Energy patterning unit 116 can include static or dynamic energy patterning elements. For example, photon, electron, or ion beams can be blocked by masks with fixed or movable elements. To increase flexibility and ease of image patterning, pixel addressable masking, image generation, or transmission can be used. In some embodiments, the energy patterning unit includes addressable light valves, alone or in conjunction with other patterning mechanisms to provide patterning. The light valves can be transmissive, reflective, or use a combination of transmissive and reflective elements. Patterns can be dynamically modified using electrical or optical addressing. In one embodiment, a transmissive optically addressed light valve acts to rotate polarization of light passing through the valve, with optically addressed pixels forming patterns defined by a light projection source. In another embodiment, a reflective optically addressed light valve includes a write beam for modifying polarization of a read beam. In yet another embodiment, an electron patterning device receives an address pattern from an electrical or photon stimulation source and generates a patterned emission of electrons.

Rejected energy handling unit 118 is used to disperse, redirect, or utilize energy not patterned and passed through the energy pattern image relay 120. In one embodiment, the rejected energy handling unit 118 can include passive or active cooling elements that remove heat from the energy patterning unit 116. In other embodiments, the rejected energy handling unit can include a "beam dump" to absorb and convert to heat any beam energy not used in defining the energy pattern. In still other embodiments, rejected beam energy can be recycled using beam shaping optics 114. Alternatively, or in addition, rejected beam energy can be directed to the article processing unit 140 for heating or further patterning. In certain embodiments, rejected beam energy can be directed to additional energy patterning systems or article processing units.

Image relay 120 receives a patterned image (typically two-dimensional) from the energy patterning unit 116 and guides it toward the article processing unit 140. In a manner similar to beam shaping optics 114, the image relay 120 can include optics to combine, focus, diverge, reflect, refract, adjust intensity, adjust frequency, or otherwise shape and direct the patterned image.

Article processing unit 140 can include a walled chamber 148 and bed 144, and a material dispenser 142 for distributing material. The material dispenser 142 can distribute, remove, mix, provide gradations or changes in material type or particle size, or adjust layer thickness of material. The material can include metal, ceramic, glass, polymeric powders, other melt-able material capable of undergoing a thermally induced phase change from solid to liquid and back again, or combinations thereof. The material can further include composites of melt-able material and non-melt-able material where either or both components can be selectively targeted by the imaging relay system to melt the component that is melt-able, while either leaving along the non-melt-able material or causing it to undergo a vaporizing/destroying/combusting or otherwise destructive process. In certain embodiments, slurries, sprays, coatings, wires, strips, or sheets of materials can be used. Unwanted material can be removed for disposable or recycling by use of blowers, vacuum systems, sweeping, vibrating, shaking, tipping, or inversion of the bed 146.

In addition to material handling components, the article processing unit 140 can include components for holding and supporting 3D structures, mechanisms for heating or cooling the chamber, auxiliary or supporting optics, and sensors and control mechanisms for monitoring or adjusting material or environmental conditions. The article processing unit can, in whole or in part, support a vacuum or inert gas atmosphere to reduce unwanted chemical interactions as well as to mitigate the risks of fire or explosion (especially with reactive metals).

Control processor 150 can be connected to control any components of additive manufacturing system 100. The control processor 150 can be connected to variety of sensors, actuators, heating or cooling systems, monitors, and controllers to coordinate operation. A wide range of sensors, including imagers, light intensity monitors, thermal, pressure, or gas sensors can be used to provide information used in control or monitoring. The control processor can be a single central controller, or alternatively, can include one or more independent control systems. The controller processor 150 is provided with an interface to allow input of manufacturing instructions. Use of a wide range of sensors allows various feedback control mechanisms that improve quality, manufacturing throughput, and energy efficiency.

Figure 1B:
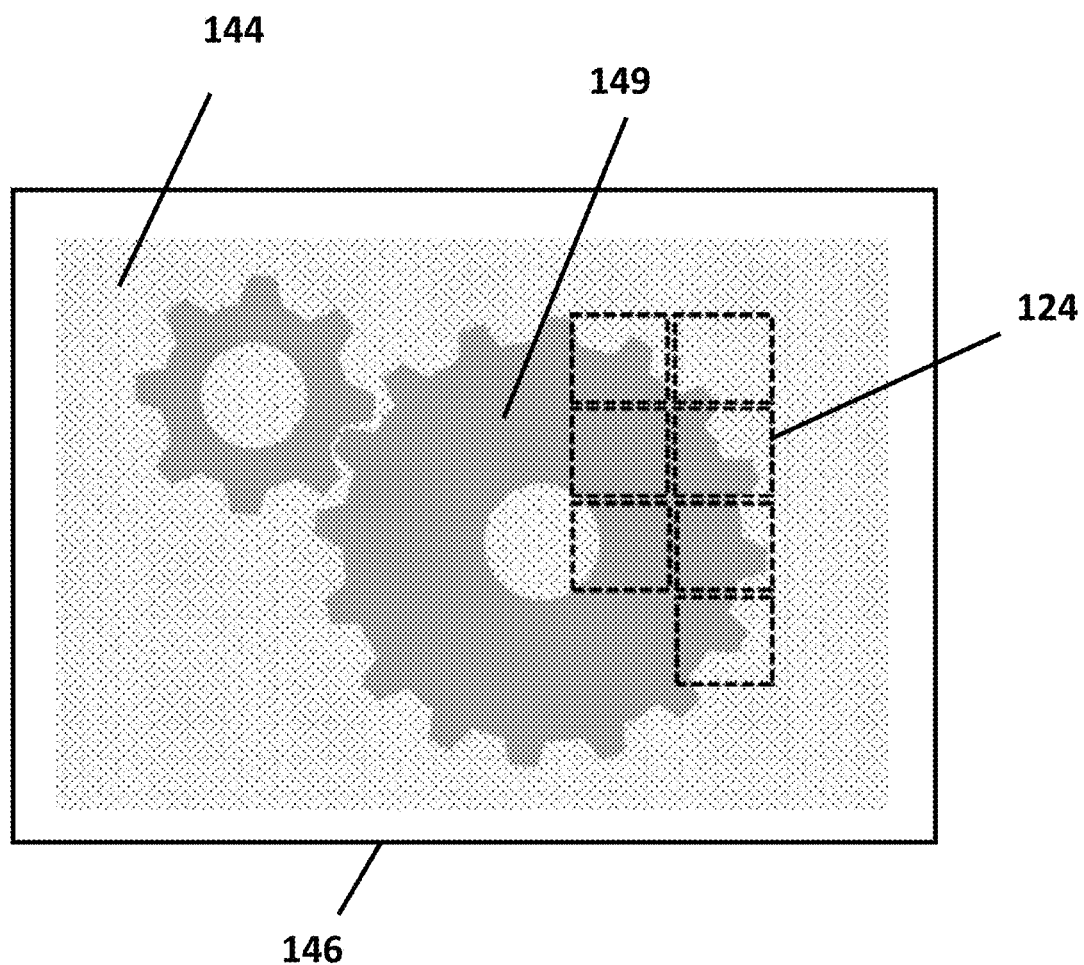
FIG. 1B is a top view of a structure being formed on an additive manufacturing system.

FIG. 1B is a cartoon illustrating a bed 146 that supports material 144. Using a series of sequentially applied, two-dimensional patterned energy beam images (squares in dotted outline 124), a structure 149 is additively manufactured. As will be understood, image patterns having non-square boundaries can be used, overlapping or interpenetrating images can be used, and images can be provided by two or more energy patterning systems. In other embodiments, images can be formed in conjunction with directed electron or ion beams, or with printed or selective spray systems.

Figure 2:
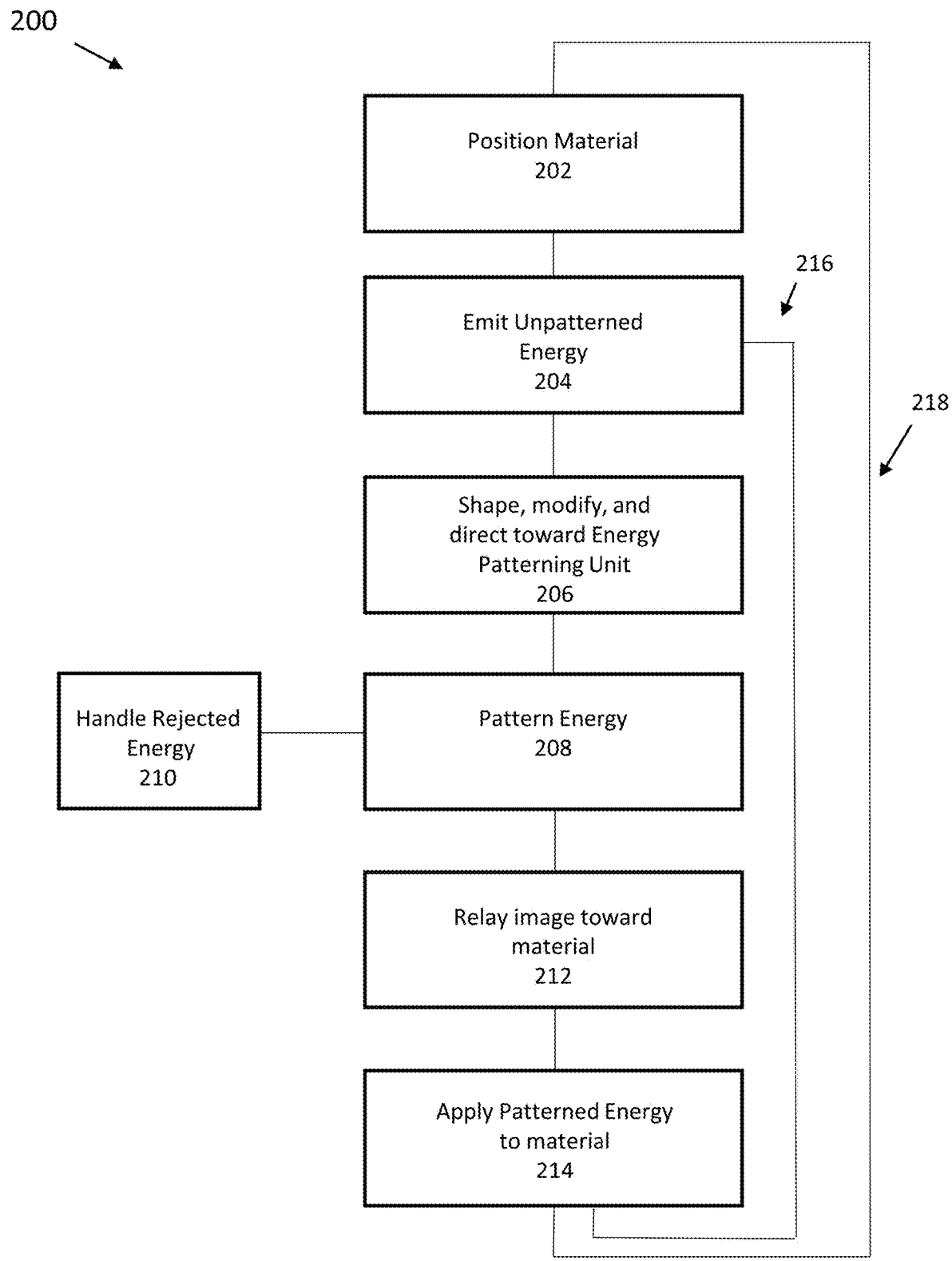
FIG. 2 illustrates an additive manufacturing method.

FIG. 2 is a flow chart illustrating one embodiment of an additive manufacturing process supported by the described optical and mechanical components. In step 202, material is positioned in a bed, chamber, or other suitable support. The material can be a powder capable of being melted, fused, sintered, induced to change crystal structure, have stress patterns influenced, or otherwise chemically or physically modified to form structures with desired properties.

In step 204, unpatterned energy is emitted by one or more energy emitters, including but not limited to solid state or semiconductor lasers, or electrical power supply flowing electrons down a wire. In step 206, the unpatterned energy is shaped and modified (e.g. intensity modulated or focused). In step 208, this unpatterned energy is patterned, with energy not forming a part of the pattern being handled in step 210 (this can include conversion to waste heat, or recycling as patterned or unpatterned energy). In step 212, the patterned energy, now forming a two-dimensional image is relayed toward the material. In step 214, the image is applied to the material, building a portion of a 3D structure. These steps can be repeated (loop 218) until the image (or different and subsequent image) has been applied to all necessary regions of a top layer of the material. When application of energy to the top layer of the material is finished, a new layer can be applied (loop 216) to continue building the 3D structure. These process loops are continued until the 3D structure is complete, when remaining excess material can be removed or recycled.

Figure 3A:
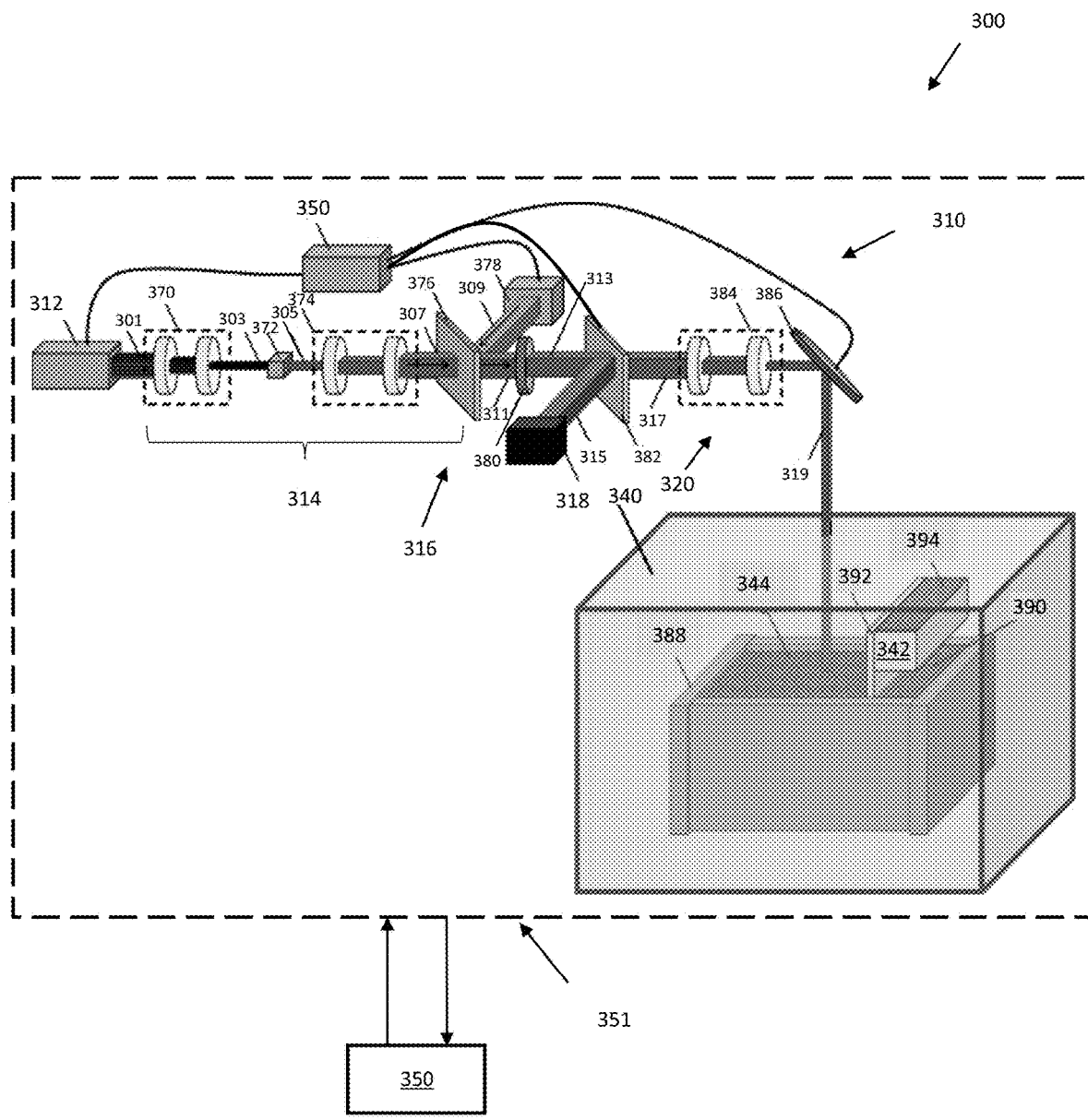
FIG. 3A is a cartoon illustrating an additive manufacturing system including lasers.

FIG. 3A is one embodiment of an additive manufacturing system 300 that uses multiple semiconductor lasers as part of an energy patterning system 310. A control processor 350 can be connected to variety of sensors, actuators, heating or cooling systems, monitors, and controllers to coordinate operation of multiple lasers 312, light patterning unit 316, and image relay 320, as well as any other component of system 300. These connections are generally indicated by a dotted outline 351 surrounding components of system 300. As will be appreciated, connections can be wired or wireless, continuous or intermittent, and include capability for feedback (for example, thermal heating can be adjusted in response to sensed temperature). The multiple lasers 312 can emit a beam 301 of light at a 1000 nm wavelength that, for example, is 90 mm wide by 20 mm tall. The beam 301 is resized by imaging optics 370 to create beam 303. Beam 303 is 6 mm wide by 6 mm tall, and is incident on light homogenization device 372 which blends light together to create blended beam 305. Beam 305 is then incident on imaging assembly 374 which reshapes the light into beam 307 and is then incident on hot cold mirror 376. The mirror 376 allows 1000 nm light to pass, but reflects 450 nm light. A light projector 378 capable of projecting low power light at 1080p pixel resolution and 450 nm emits beam 309, which is then incident on hot cold mirror 376. Beams 307 and 309 overlay in beam 311, and both are imaged onto optically addressed light valve 380 in a 20 mm wide, 20 mm tall image. Images formed from the homogenizer 372 and the projector 378 are recreated and overlaid on light valve 380.

The optically addressed light valve 380 is stimulated by the light (typically ranging from 400-500 nm) and imprints a polarization rotation pattern in transmitted beam 313 which is incident upon polarizer 382. The polarizer 382 splits the two polarization states, transmitting p-polarization into beam 317 and reflecting s-polarization into beam 315 which is then sent to a beam dump 318 that handles the rejected energy. As will be understood, in other embodiments the polarization could be reversed, with s-polarization formed into beam 317 and reflecting p-polarization into beam 315. Beam 317 enters the final imaging assembly 320 which includes optics 384 that resize the patterned light. This beam reflects off of a movable mirror 386 to beam 319, which terminates in a focused image applied to material bed 344 in an article processing unit 340. The depth of field in the image selected to span multiple layers, providing optimum focus in the range of a few layers of error or offset.

The bed 390 can be raised or lowered (vertically indexed) within chamber walls 388 that contain material 344 dispensed by material dispenser 342. In certain embodiments, the bed 390 can remain fixed, and optics of the final imaging assembly 320 can be vertically raised or lowered. Material distribution is provided by a sweeper mechanism 392 that can evenly spread powder held in hopper 394, being able to provide new layers of material as needed. An image 6 mm wide by 6 mm tall can be sequentially directed by the movable mirror 386 at different positions of the bed.

When using a powdered ceramic or metal material in this additive manufacturing system 300, the powder can be spread in a thin layer, approximately 1-3 particles thick, on top of a base substrate (and subsequent layers) as the part is built. When the powder is melted, sintered, or fused by a patterned beam 319, it bonds to the underlying layer, creating a solid structure. The patterned beam 319 can be operated in a pulsed fashion at 40 Hz, moving to the subsequent 6 mm×6 mm image locations at intervals of 10 ms to 0.5 ms (with 3 to 0.1 ms being desirable) until the selected patterned areas of powder have been melted. The bed 390 then lowers itself by a thickness corresponding to one layer, and the sweeper mechanism 392 spreads a new layer of powdered material. This process is repeated until the 2D layers have built up the desired 3D structure. In certain embodiments, the article processing unit 340 can have a controlled atmosphere. This allows reactive materials to be manufactured in an inert gas, or vacuum environment without the risk of oxidation or chemical reaction, or fire or explosion (if reactive metals are used).

Figure 3B:
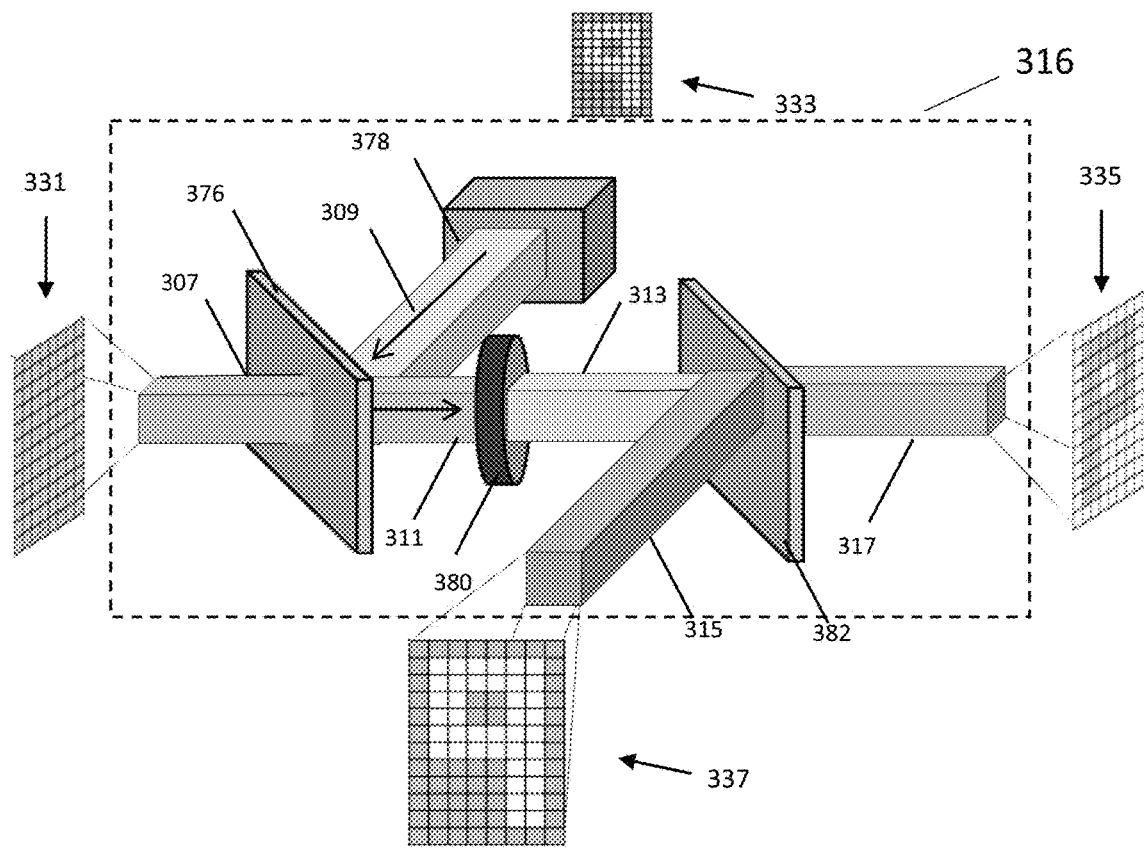
FIG. 3B is a detailed description of the light patterning unit shown in FIG. 3A.

FIG. 3B illustrates in more detail operation of the light patterning unit 316 of FIG. 3A. As seen in FIG. 3B, a representative input pattern 333 (here seen as the numeral "9") is defined in an 8×12 pixel array of light projected as beam 309 toward mirror 376. Each grey pixel represents a light filled pixel, while white pixels are unlit. In practice, each pixel can have varying levels of light, including light-free, partial light intensity, or maximal light intensity. Unpatterned light 331 that forms beam 307 is directed and passes through a hot/cold mirror 376, where it combines with patterned beam 309. After reflection by the hot/cold mirror 376, the patterned light beam 311 formed from overlay of beams 307 and 309 in beam 311, and both are imaged onto optically addressed light valve 380. The optically addressed light valve 380, which would rotate the polarization state of unpatterned light 331, is stimulated by the patterned light beam 309, 311 to selectively not rotate the polarization state of polarized light 307, 311 in the pattern of the numeral "9" into beam 313. The unrotated light representative of pattern 333 in beam 313 is then allowed to pass through polarizer mirror 382 resulting in beam 317 and pattern 335. Polarized light in a second rotated state is rejected by polarizer mirror 382, into beam 315 carrying the negative pixel pattern 337 consisting of a light-free numeral "9".

Other types of light valves can be substituted or used in combination with the described light valve. Reflective light valves, or light valves base on selective diffraction or refraction can also be used. In certain embodiments, non-optically addressed light valves can be used. These can include but are not limited to electrically addressable pixel elements, movable mirror or micro-mirror systems, piezo or micro-actuated optical systems, fixed or movable masks, or shields, or any other conventional system able to provide high intensity light patterning. For electron beam patterning, these valves may selectively emit electrons based on an address location, thus imbuing a pattern on the beam of electrons leaving the valve.

Figure 3C:
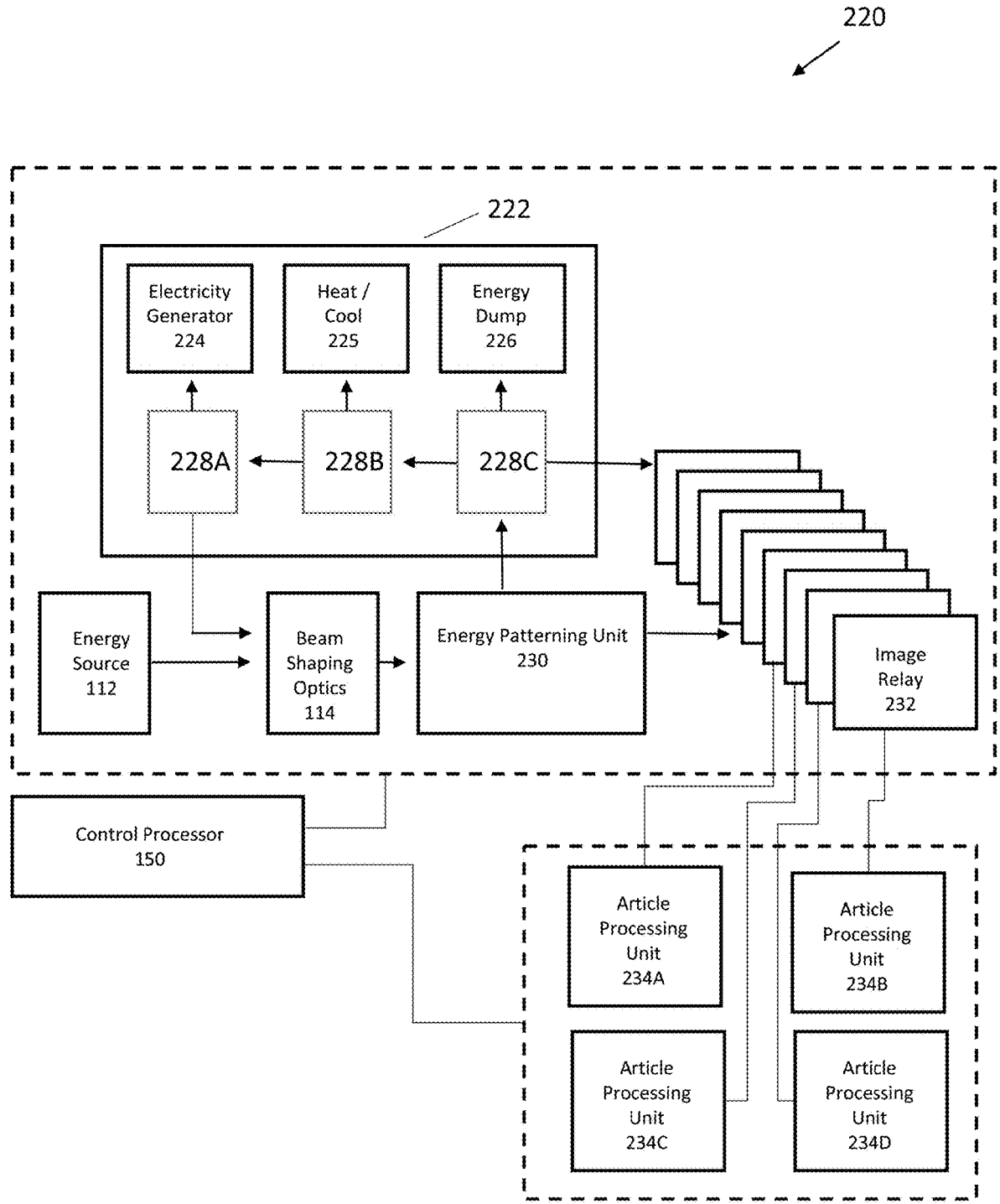
FIG. 3C is one embodiment of an additive manufacturing system with a "switchyard" for directing and repatterning light using multiple image relays.

FIG. 3C is one embodiment of an additive manufacturing system that includes a switchyard system enabling reuse of patterned two-dimensional energy. Similar to the embodiment discussed with respect to FIG. 1A, an additive manufacturing system 220 has an energy patterning system with an energy source 112 that directs one or more continuous or intermittent energy beam(s) toward beam shaping optics 114. After shaping, the beam is two-dimensionally patterned by an energy patterning unit 230, with generally some energy being directed to a rejected energy handling unit 222. Patterned energy is relayed by one of multiple image relays 232 toward one or more article processing units 234A, 234B, 234C, or 234D, typically as a two-dimensional image focused near a movable or fixed height bed. The bed (with optional walls) can form a chamber containing material dispensed by material dispenser. Patterned energy, directed by the image relays 232, can melt, fuse, sinter, amalgamate, change crystal structure, influence stress patterns, or otherwise chemically or physically modify the dispensed material to form structures with desired properties.

In this embodiment, the rejected energy handling unit has multiple components to permit reuse of rejected patterned energy. Relays 228A, 228B, and 22C can respectively transfer energy to an electricity generator 224, a heat/cool thermal management system 225, or an energy dump 226. Optionally, relay 228C can direct patterned energy into the image relay 232 for further processing. In other embodiments, patterned energy can be directed by relay 228C, to relay 228B and 228A for insertion into the energy beam(s) provided by energy source 112. Reuse of patterned images is also possible using image relay 232. Images can be redirected, inverted, mirrored, sub-patterned, or otherwise transformed for distribution to one or more article processing units. 234A-D. Advantageously, reuse of the patterned light can improve energy efficiency of the additive manufacturing process, and in some cases improve energy intensity directed at a bed, or reduce manufacture time.

Figure 3D:
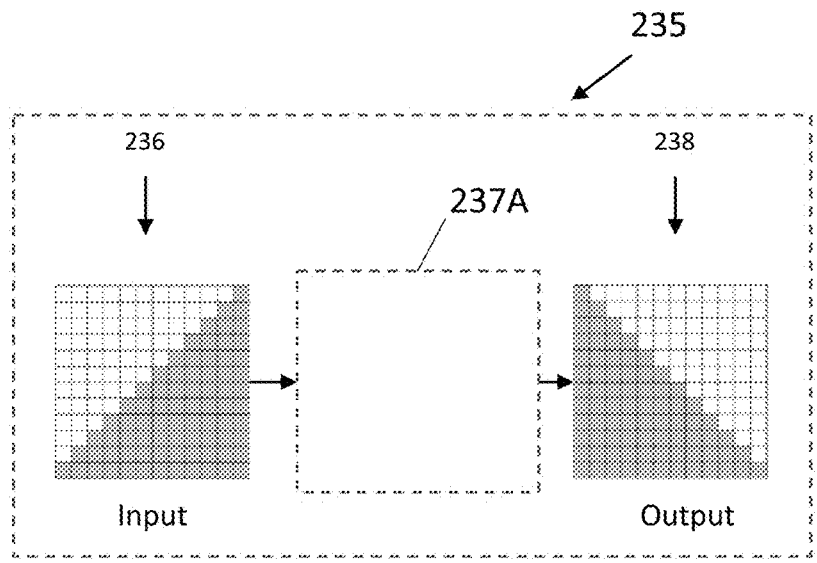
FIG. 3D illustrates a simple mirror image pixel remapping.

FIG. 3D is a cartoon 235 illustrating a simple geometrical transformation of a rejected energy beam for reuse. An input pattern 236 is directed into an image relay 237 capable of providing a mirror image pixel pattern 238. As will be appreciated, more complex pixel transformations are possible, including geometrical transformations, or pattern remapping of individual pixels and groups of pixels. Instead of being wasted in a beam dump, this remapped pattern can be directed to an article processing unit to improve manufacturing throughput or beam intensity.

Figure 3E:
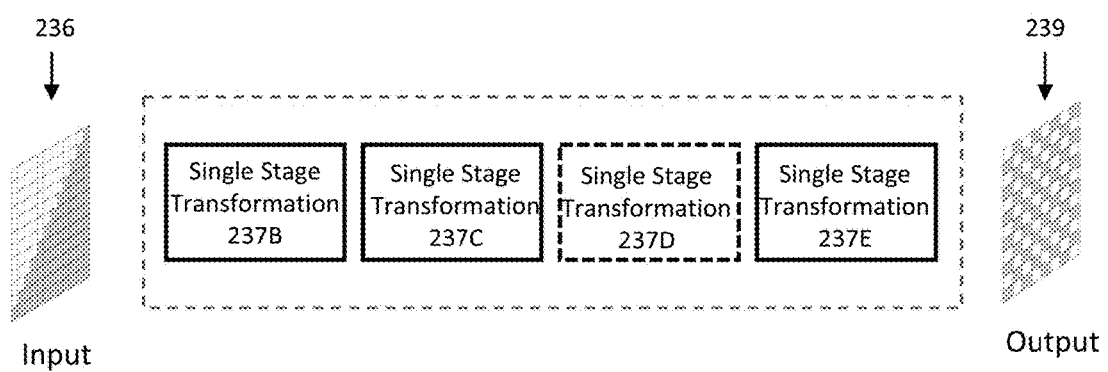
FIG. 3E illustrates a series of image transforming image relays for pixel remapping.

FIG. 3E is a cartoon 235 illustrating multiple transformations of a rejected energy beam for reuse. An input pattern 236 is directed into a series of image relays 237B-E capable of providing a pixel pattern 238.

Figure 3F:
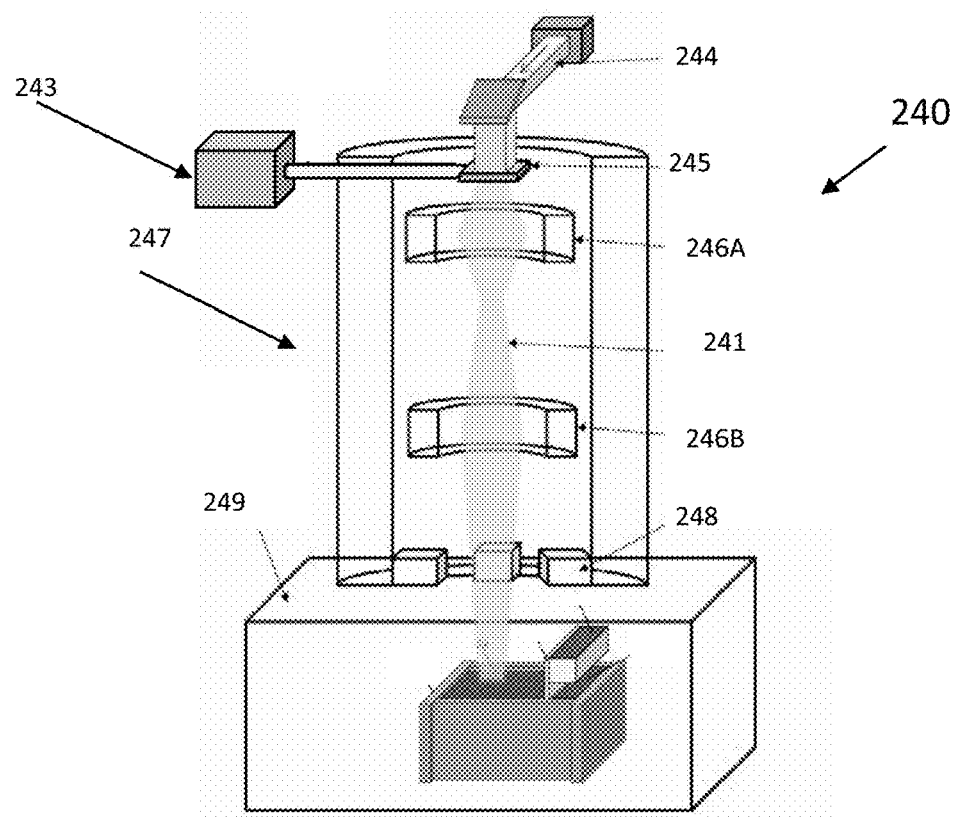
FIG. 3F illustrates an patternable electron energy beam additive manufacturing system.
Figure 3G:
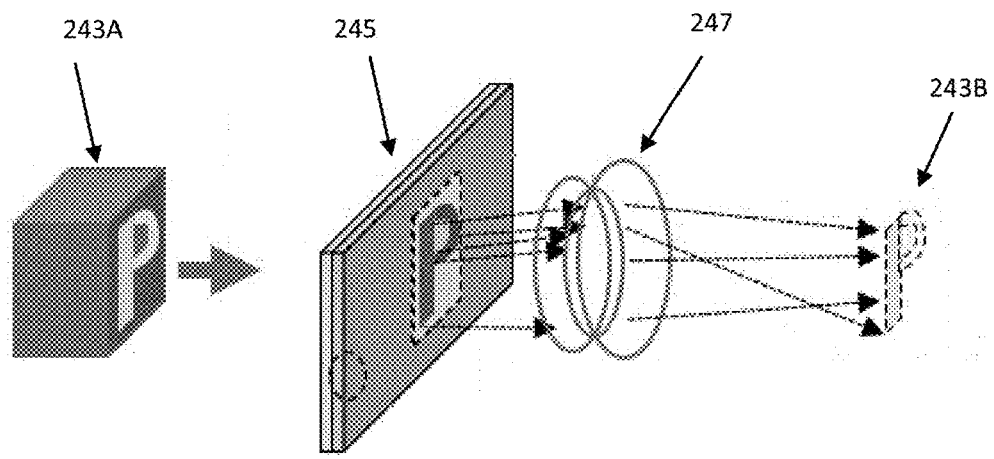
FIG. 3G illustrates a detailed description of the electron beam patterning unit shown in FIG. 3F.

FIGS. 3F and 3G illustrates a non-light based energy beam system 240 that includes a patterned electron beam 241 capable of producing, for example, a "P" shaped pixel image. A high voltage electricity power system 243 is connected to an optically addressable patterned cathode unit 245. In response to application of a two-dimensional patterned image by projector 244, the cathode unit 245 is stimulated to emit electrons wherever the patterned image is optically addressed. Focusing of the electron beam pattern is provided by an image relay system 247 that includes imaging coils 246A and 246B. Final positioning of the patterned image is provided by a deflection coil 248 that is able to move the patterned image to a desired position on a bed of additive manufacturing component 249.

In another embodiment supporting light recycling and reuse, multiplex multiple beams of light from one or more light sources are provided. The multiple beams of light may be reshaped and blended to provide a first beam of light. A spatial polarization pattern may be applied on the first beam of light to provide a second beam of light. Polarization states of the second beam of light may be split to reflect a third beam of light, which may be reshaped into a fourth beam of light. The fourth beam of light may be introduced as one of the multiple beams of light to result in a fifth beam of light. In effect, this or similar systems can reduce energy costs associated with an additive manufacturing system. By collecting, beam combining, homogenizing and re-introducing unwanted light rejected by a spatial polarization valve or light valve operating in polarization modification mode, overall transmitted light power can potentially be unaffected by the pattern applied by a light valve. This advantageously results in an effective re-distribution of the light passing through the light valve into the desired pattern, increasing the light intensity proportional to the amount of area patterned.

Combining beams from multiple lasers into a single beam is one way to increasing beam intensity. In one embodiment, multiple light beams, each having a distinct light wavelength, can be combined using either wavelength selective mirrors or diffractive elements. In certain embodiments, reflective optical elements that are not sensitive to wavelength dependent refractive effects can be used to guide a multiwavelength beam.

Patterned light can be directed using movable mirrors, prisms, diffractive optical elements, or solid state optical systems that do not require substantial physical movement. In one embodiment, a magnification ratio and an image distance associated with an intensity and a pixel size of an incident light on a location of a top surface of a powder bed can be determined for an additively manufactured, three-dimensional (3D) print job. One of a plurality of lens assemblies can be configured to provide the incident light having the magnification ratio, with the lens assemblies both a first set of optical lenses and a second sets of optical lenses, and with the second sets of optical lenses being swappable from the lens assemblies. Rotations of one or more sets of mirrors mounted on compensating gantries and a final mirror mounted on a build platform gantry can be used to direct the incident light from a precursor mirror onto the location of the top surface of the powder bed. Translational movements of compensating gantries and the build platform gantry are also able to ensure that distance of the incident light from the precursor mirror to the location of the top surface of the powder bed is substantially equivalent to the image distance. In effect, this enables a quick change in the optical beam delivery size and intensity across locations of a build area for different powdered materials while ensuring high availability of the system.

In certain embodiments, a plurality of build chambers, each having a build platform to hold a powder bed, can be used in conjunction with multiple optical-mechanical assemblies arranged to receive and direct the one or more incident energy beams into the build chambers. Multiple chambers allow for concurrent printing of one or more print jobs inside one or more build chambers. In other embodiments, a removable chamber sidewall can simplify removal of printed objects from build chambers, allowing quick exchanges of powdered materials. The chamber can also be equipped with an adjustable process temperature controls.

In another embodiment, one or more build chambers can have a build chamber that is maintained at a fixed height, while optics are vertically movable. A distance between final optics of a lens assembly and a top surface of powder bed a may be managed to be essentially constant by indexing final optics upwards, by a distance equivalent to a thickness of a powder layer, while keeping the build platform at a fixed height. Advantageously, as compared to a vertically moving the build platform, large and heavy objects can be more easily manufactured, since precise micron scale movements of the build platform are not needed. Typically, build chambers intended for metal powders with a volume more than ~0.1-0.2 cubic meters (i.e., greater than 100-200 liters or heavier than 500-1,000 kg) will most benefit from keeping the build platform at a fixed height.

In one embodiment, a portion of the layer of the powder bed may be selectively melted or fused to form one or more temporary walls out of the fused portion of the layer of the powder bed to contain another portion of the layer of the powder bed on the build platform. In selected embodiments, a fluid passageway can be formed in the one or more first walls to enable improved thermal management.

Improved powder handling can be another aspect of an improved additive manufacturing system. A build platform supporting a powder bed can be capable of tilting, inverting, and shaking to separate the powder bed substantially from the build platform in a hopper. The powdered material forming the powder bed may be collected in a hopper for reuse in later print jobs. The powder collecting process may be automated, and vacuuming or gas jet systems also used to aid powder dislodgement and removal Some embodiments of the disclosed additive manufacturing system can be configured to easily handle parts longer than an available chamber. A continuous (long) part can be sequentially advanced in a longitudinal direction from a first zone to a second zone. In the first zone, selected granules of a granular material can be amalgamated. In the second zone, unamalgamated granules of the granular material can be removed. The first portion of the continuous part can be advanced from the second zone to a third zone, while a last portion of the continuous part is formed within the first zone and the first portion is maintained in the same position in the lateral and transverse directions that the first portion occupied within the first zone and the second zone. In effect, additive manufacture and clean-up (e.g., separation and/or reclamation of unused or unamalgamated granular material) may be performed in parallel (i.e., at the same time) at different locations or zones on a part conveyor, with no need to stop for removal of granular material and/or parts.

In another embodiment, additive manufacturing capability can be improved by use of an enclosure restricting an exchange of gaseous matter between an interior of the enclosure and an exterior of the enclosure. An airlock provides an interface between the interior and the exterior; with the interior having multiple additive manufacturing chambers, including those supporting power bed fusion. A gas management system maintains gaseous oxygen within the interior at or below a limiting oxygen concentration, increasing flexibility in types of powder and processing that can be used in the system.

In another manufacturing embodiment, capability can be improved by having a 3D printer contained within an enclosure, the printer able to create a part having a weight greater than or equal to 2,000 kilograms. A gas management system may maintain gaseous oxygen within the enclosure at concentrations below the atmospheric level. In some embodiments, a wheeled vehicle may transport the part from inside the enclosure, through an airlock, since the airlock operates to buffer between a gaseous environment within the enclosure and a gaseous environment outside the enclosure, and to a location exterior to both the enclosure and the airlock.

Other manufacturing embodiments involve collecting powder samples in real-time in a powder bed fusion additive manufacturing system. An ingester system is used for in-process collection and characterizations of powder samples. The collection may be performed periodically and the results of characterizations result in adjustments to the powder bed fusion process. The ingester system can optionally be used for one or more of audit, process adjustments or actions such as modifying printer parameters or verifying proper use of licensed powder materials.

Yet another improvement to an additive manufacturing process can be provided by use of a manipulator device such as a crane, lifting gantry, robot arm, or similar that allows for the manipulation of parts that would be difficult or impossible for a human to move is described. The manipulator device can grasp various permanent or temporary additively manufactured manipulation points on a part to enable repositioning or maneuvering of the part.

Figure 4:
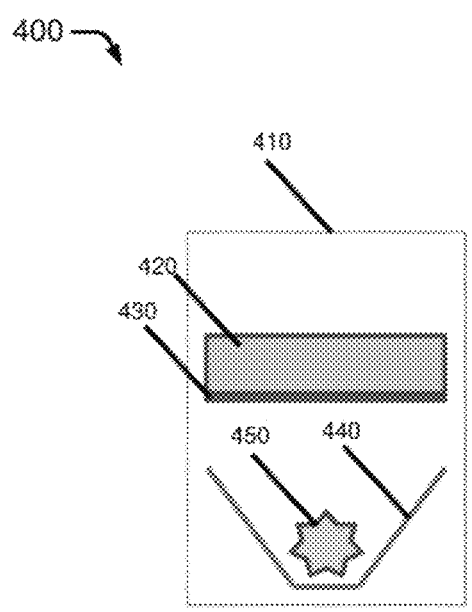
FIG. 4 is a diagram depicting an example scenario in which a powder bed is formed on a build platform during or after a print cycle.

FIG. 4 illustrates an example scenario 400 in which a powder bed 420 is formed on a build platform 430 in accordance with the present disclosure may be utilized. The build platform 430 may have an area of 0.25 square meter and may support a powder bed 420 of a powdered material, which may be 0.5 m deep inside a build chamber 410. Scenario 400 may be at the end, or in the middle of a print cycle. Below the build platform 430 is a hopper 440 with sloped walls which may be 45-60 degrees relative to a horizontal surface on which build platform 430 is disposed. In some embodiments, hopper 440 may contain an auger 450.

Figure 5:
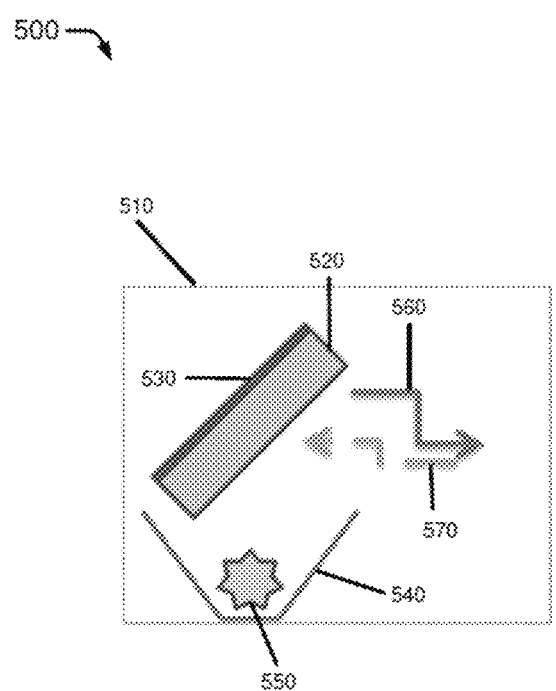
FIG. 5 is a diagram depicting another example scenario in which a powder bed is separated from a build platform by tilting the build platform towards a hopper below.

FIG. 5 illustrates another example scenario 500 in which the separation of a powder bed 520 from a build platform 530 is depicted. Scenario 500 may be at the end of a print cycle or in a mid-cycle that is aborted due to various reasons. Inside a build chamber 510, a build platform 530 supporting the powder bed 520 may be moved or tilted over 90 degrees from a horizontal position. The gravity pull due to the weight of the powder bed 520 causes the powdered material and the printed object(s) embedded within the powder bed 520 to fall in a hopper 540 below. The build chamber 510 may include a vacuum 560 and a high pressure jet 570 so that a substantial portion of powders may be collected in the hopper 540. The vacuuming 560 and gas jetting 570 may be utilized to dislodge sticky powders remained on the build platform 530 after tilting the build platform 530. The hopper 540 may have sloped walls to help guide powders onto the bottom of the hopper 540. The hopper 540 may include an auger 550.

In some embodiments, the build platform 530 may be capable of causing or otherwise performing vibrations, shaking, or jittering moves to dislodge remaining powders on the build platform 530 after the powder bed 520 has fallen into the hopper 540.

In some embodiments, the build chamber 510 may be equipped with a mechanical arm capable of sweeping the surface of the build platform 530.

In some embodiments, a camera may be mounted inside the build chamber 510 to provide a real-time feedback of the powder removal process.

In some embodiments, the printed object(s) may be separated from the powder bed 520 (or powders) using a mechanical arm.

Figure 6:
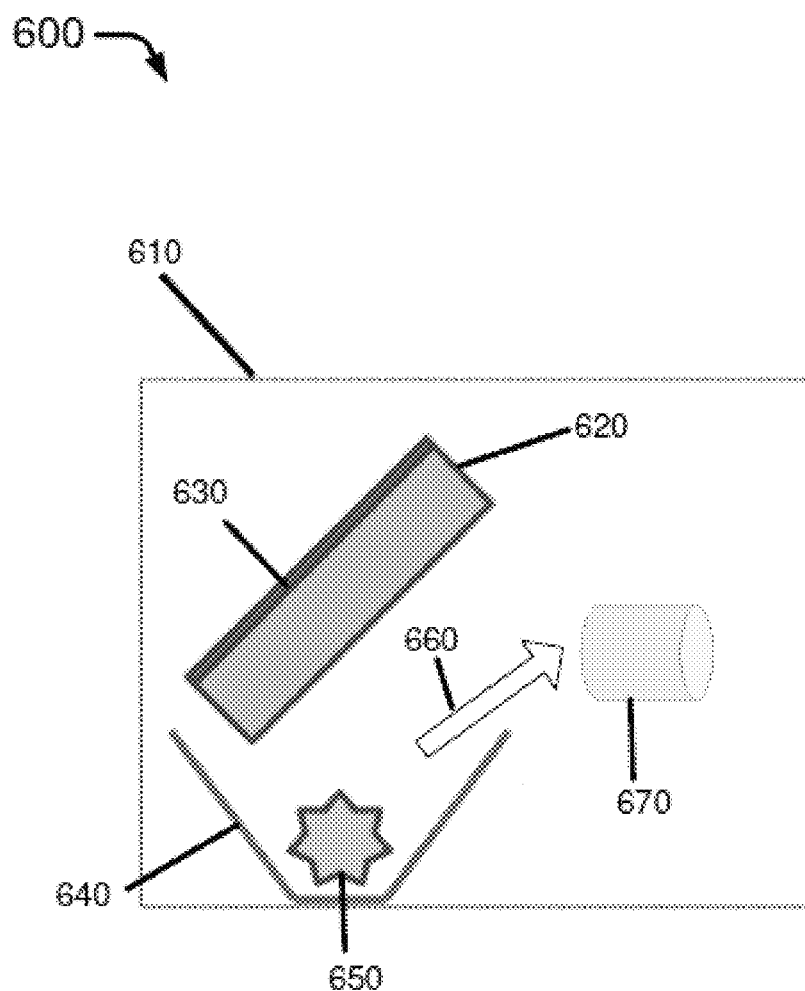
FIG. 6 is a diagram depicting an example apparatus of collecting a powdered material from a hopper using a combination of an auger and a vacuum.

FIG. 6. illustrates another example scenario 600 in which a substantial portion of powders may be recycled and sealed in a storage chamber 670. Inside a build chamber 610, powders collected in a hopper 640 may be transported into storage chamber 670 by an anger, vacuum, conveyor, or any combination thereof. Arrow 660 indicates a direction of movement of the powdered material from hopper 640 to storage chamber 670. The powdered material may be, for example and without limitation, moved by a sucking action by a vacuum in build chamber 610. Alternatively or additionally, an auger 650 may rotate and push the powdered material toward the storage chamber 670.

In some embodiments, hopper 640 may be equipped with a conveyer carrying the powders to storage chamber 670. The conveyer may be used in combination with a vacuum and/or auger 650.

In some embodiments, storage chamber 670 may be sealed in an atmosphere such as air, nitrogen, argon, helium, other inert gas, or noble gas.

Figure 7:
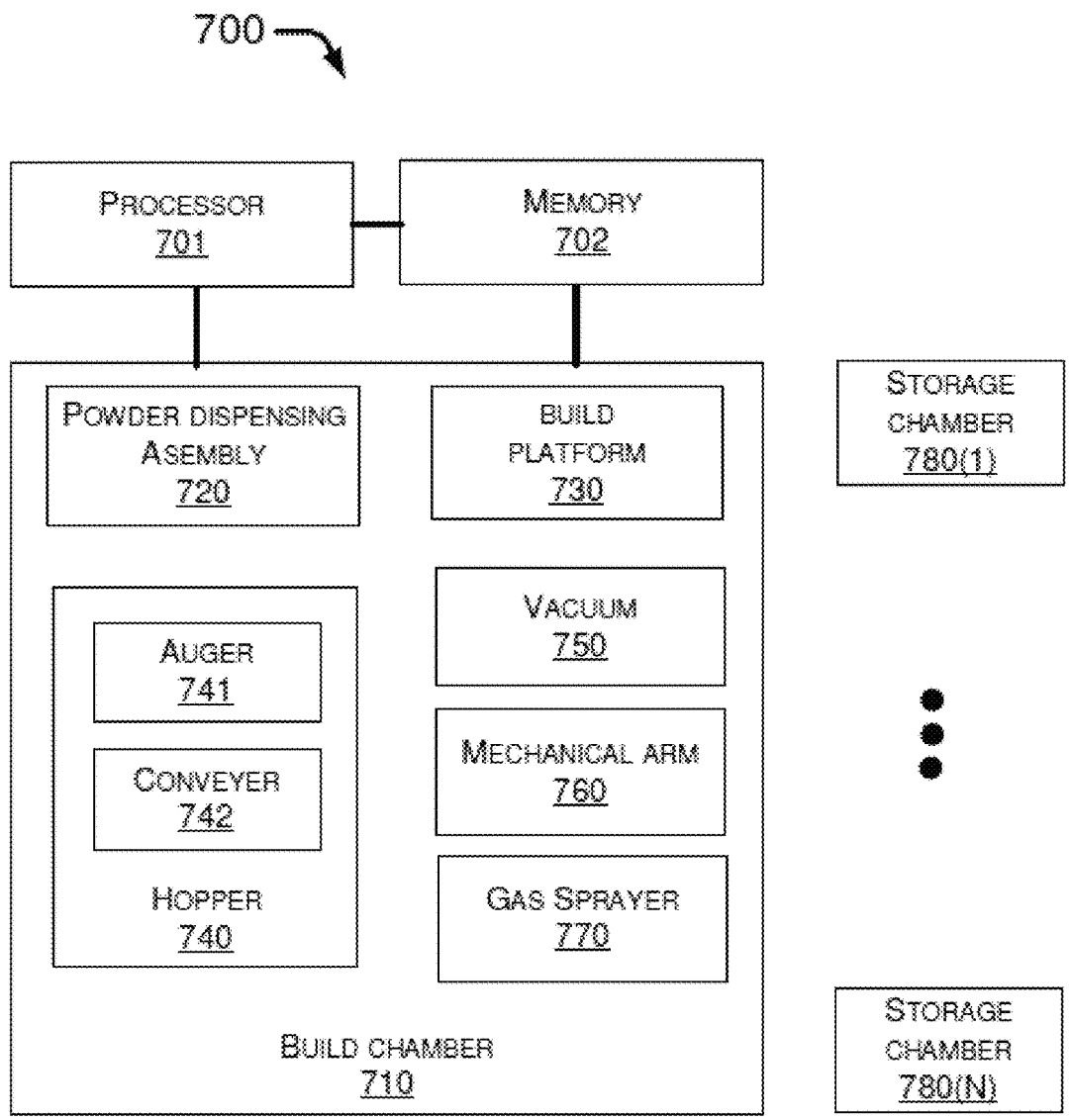
FIG. 7 is a block diagram illustrating an example apparatus of powder collection for powder fusion bed additive manufacturing.

FIG. 7 illustrates an example apparatus 700 capable of automatically collecting powders for reuse or for storage. Apparatus 700 may perform various functions related to techniques, methods and systems described herein, including those described above with respect to scenario 400, 500, and 600 described above as well as those described below with respect to scenario 800 and process 900 described below. Apparatus 700 may be installed in, equipped on, or otherwise implemented in a powder bed fusion additive manufacturing system as described in FIGS. 1A-3B to effect various embodiments in accordance with the present disclosure. Apparatus 700 may include at least some of the components illustrated in FIG. 7.

In some embodiments, apparatus 700 may include a powder dispensing assembly 720 and a build platform 730 inside a build chamber 710. Powder dispensing assembly 720 may dispense layers of a powdered material on build platform 730 to form a powder bed such as powder bed 420 in scenario 400. Powder dispensing assembly 720 may be height adjustable in the vertical direction to maintain a constant separation from the surface of the powder bed during a print cycle. Build platform 730 may be capable of a rotation, a tilt, or an inversion for dumping the powder bed into a hopper 740 below build platform 730. Build platform 730 may be also capable of vibrations and/or jittering moves to loosen the powdered material on build platform 730. It is noteworthy that, although a single build chamber 710 is shown in FIG. 7 and described herein, in various embodiments, apparatus 700 may include multiple build chambers similar to build chamber 710 with similar components thereof. That is, although a single build chamber 710 is shown and described herein, in various embodiments of apparatus 700 there may be multiple build chambers.

Apparatus 700 may include hopper 740 to collect a powdered material when build platform 730 supporting a powder bed is tilted or inverted. Hopper 740 may further include an auger 741 and/or a conveyer 742.

Apparatus 700 may include a plurality of storage chambers 780(1)-780(N), each configured to store a respective powdered material in a respective atmosphere suitable for the powdered material, respectively. The atmosphere may include, for example and without limitation, air, nitrogen, argon, helium, other inert gas, or noble gas.

Apparatus 700 may include a vacuum 750 inside build chamber 710 for cleaning build platform 730 or transporting powders to one or more of storage chambers 780(1)-780(N) by suction.

Apparatus 700 may include a high pressure gas sprayer 770 inside build chamber 710 to clean build platform 730 by gas-jetting.

Apparatus 700 may include a mechanical arm 760 inside build chamber 710 to separate printed object(s) from a powder bed and sweep the surface of build platform 730 that supports the powder bed.

In some embodiments, powders collected in hopper 740 may be carried to one or more of storage chambers 780(1)-780(N) by auger 741 and/or conveyer 742 in combination with a vacuum 750.

In some embodiments, apparatus 700 may include processor 701 and memory 702. Processor 701 may be coupled to memory 702 to access data stored therein and to execute any programs/instructions stored therein. Processor 701 may control a motion of powder dispensing assembly 720 and a thickness as well as rate of dispensed layer in the process of forming the powder bed during a print cycle. Processor 701 may execute instructions to cause build platform 730 to perform operations including tilting, inverting, and shaking to separate a powder bed, such as powder bed 520, from build platform 730 by gravity. Processor 701 may communicate with and control vacuum 750 to perform a sucking action. The sucking action may be used to transport powders in hopper 740 into one or more of storage chambers 780(1)-780(N). Processor 701 may communicate with and control gas sprayer 770 to perform gas-jetting to blow off sticky powders on build platform 730. Process 701 may communicate with and control mechanical arm 760 to separate printed object(s) from the powder bed or perform sweeping action(s) to sweep a supporting surface on build platform 730 clean of powders. Processor 701 may communicate with and control auger 741 and/or conveyer 742 to transport powders in hopper 740 into one or more of storage chambers 780(1)-780(N).

Figure 8:
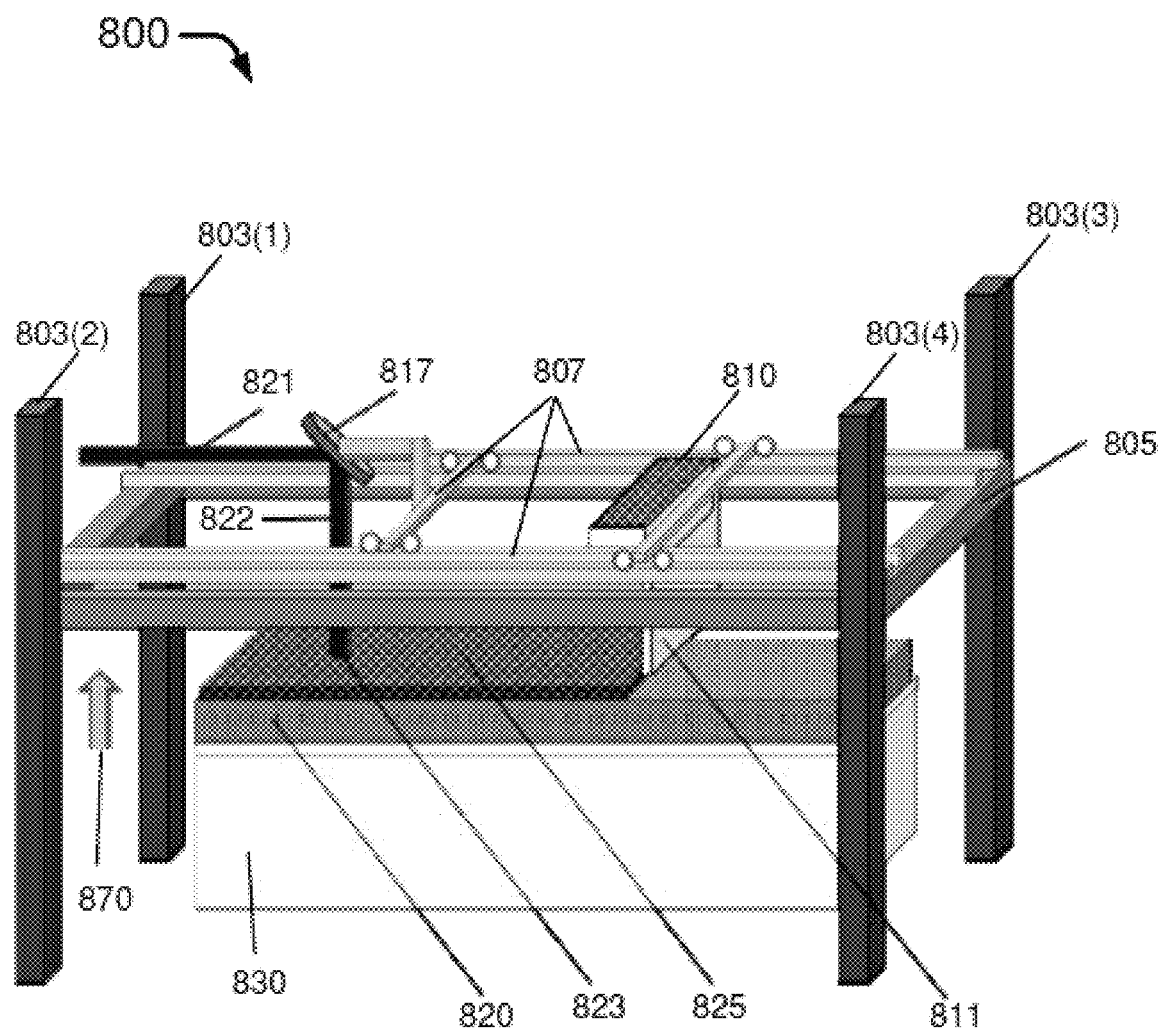
FIG. 8 is a diagram depicting an example scenario of dispensing powders layers on a build platform during a print process while indexing upwards the powder dispensing assembly.

FIG. 8 illustrates example scenario 800 of an intermediate point in a powder bed fusion additive manufacturing printing process in accordance with the present disclosure. Scenario 800 may be similar to scenario 400 as showing upward movements of additional components in the build chamber while controlling the depth of field with a stationary build platform 830. Build platform 830 may have an area of 0.5 meter by 1 meter on which powders are dispensed during a print cycle. Vertical columns 803(1)-803(4), which may be at a height of 3 meters, support a gantry 807 mounted on a gantry table 805. Powder dispensing unit 810, compacting functionality 811, and mirror 817 are mounted on gantry 807 for translational movements in a horizontal plane. Gantry table 805 is shown at a position higher above a powder bed 820 in FIG. 8 to reflect that printing may be in progress. Powder bed 820 contains both powder layers and printed object(s) in various stages of completion. A new layer of powders 825 is dispensed from powder dispensing unit 810, which may perform functions including powder spreading and compacting. Beam 821 incident from print head (not shown) reflects off mirror 817 and becomes beam 822 impinging upon a location 823 in the new layer of powders 825. Printing occurs via melting or sintering of powders at location 823 in the new layer of powders 825. The distance between mirror 817 and the location 823 in the new layer of powders 825 is the depth of field that needs to be tightly controlled to satisfy a resolution requirement. An upward movement of gantry table 805, which supports gantry 807, powder dispensing unit 810, and mirror 817, is shown by arrow 870.

In some embodiments, build platform 830 may have an area of more than 0.25 square meters. Alternatively, build platform 830 may have an area of more than 0.5 square meters. Alternatively, build platform 830 may have an area of more than 1 square meters. Alternatively, build platform 830 may have an area of more than 5 square meters. Alternatively, build platform 830 may have an area of more than 10 square meters. Alternatively, build platform 830 may have an area of more than 50 square meters.

In some embodiments, powder bed 820 including the printed object of may have a mass of more than 10 kilograms. Alternatively, powder bed 820 including the printed object a mass of more than 50 kilograms. Alternatively, powder bed 820 including the printed object may have a mass of more than 100 kilograms. Alternatively, powder bed 820 including the printed object may have a mass of more than 500 kilograms. Alternatively, powder bed 820 including the printed object may have a mass of more than 1,000 kilograms. Alternatively, powder bed 820 including the printed object may have a mass of more than 5,000 kilograms. Alternatively, powder bed 820 including the printed object may have a mass of more than 10,000 kilograms.

In some embodiments, build platform 830 may have an area of more than 0.25 square meters. In such cases, powder bed 820 and the printed object may have a mass of more than 10 kilograms.

Figure 9:
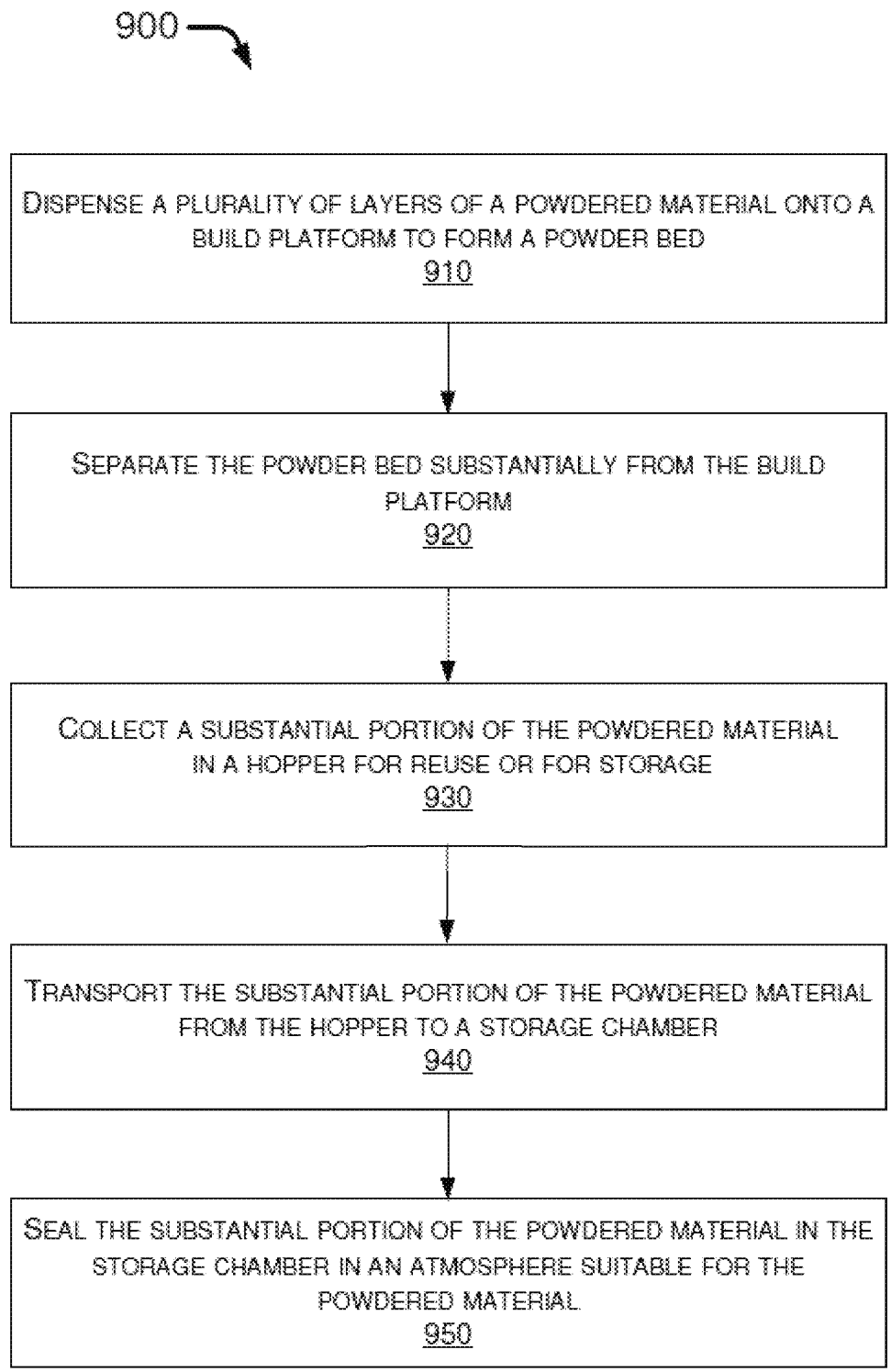
FIG. 9 is a flowchart depicting an example process of collecting a powdered material for reuse or for storage after a print cycle.

FIG. 9 illustrates an example process 900 of automatically collecting a powdered material for reuse or for storage in powder bed fusion additive manufacturing. Process 900 may be utilized to collect the powders in a hopper by separating a powder bed from a build platform, and transport the powders in the hopper into a sealed storage chamber in accordance with the present disclosure. Process 900 may include one or more operations, actions, or functions shown as blocks such as 910, 920, 930, 940, and 950. Although illustrated as discrete blocks, various blocks of process 900 may be divided into additional blocks, combined into fewer blocks, or eliminated, depending on the desired implementation, and may be performed or otherwise carried out in an order different from that shown in FIG. 9. Process 900 may be implemented in scenarios 400, 500, and 600, and may be implemented by apparatus 700. For illustrative purposes and without limiting the scope of process 900, the following description of process 900 is provided in the context of scenarios 400, 500, and 600 as being implemented by apparatus 700. Process 900 may begin with block 910.

At 910, process 900 may involve processor 701 of apparatus 700 controlling powder dispensing assembly 720 to dispense a plurality of layers of a powdered material in forming a powder bed during a print cycle. At 910, processor 701 may also control a vertical motion of powder dispensing assembly 720 to maintain a constant separation from the powder bed. The vertical motion results in indexing powder dispensing assembly 720 away from the powder bed (e.g., upwards) by a distance equivalent to a thickness of a dispensed powder layer after a portion of dispensed powder layer is bonded together. Process 900 may proceed from 910 to 920 after a print cycle is finished or aborted.

At 920, process 900 may involve processor 701 of apparatus 700 controlling a plurality of motions of build platform 730. The motions of build platform 730 may include rotating, tilting, inverting, vibrating, shaking and/or jittering. As a result of these motions, the powder bed on build platform 730 may fall into hopper 740 below build platform 730 due to weight of the powder bed. Process 900 may proceed from 920 to 930.

At 930, process 900 may involve processor 701 of apparatus 700 controlling vacuum 750, mechanical arm 760, and/or gas sprayer 770 to further dislodge remaining powders on build platform 730. Thus, a substantial portion of the powdered material may be collected in hopper 740 for reuse or for storage. In some embodiments, mechanical arm 760 may be used to separate printed object(s) from the powder bed. Process 900 may proceed from 930 to 940.

At 940, process 900 may involve processor 701 of apparatus 700 controlling auger 741 and/or conveyer 742 to transport collected powders in hopper 740 towards one or more of storage chambers 780(1)-780(N). At 940, auger 741 and/or conveyer 742 may be used in combination with vacuum 750 to increase efficiency and/or effectiveness. Process 900 may proceed from 940 to 950.

At 950, process 900 may perform sealing a substantial portion of the powdered material in one or more of storage chambers 780(1)-780(N) in an atmosphere suitable for the powdered material. The atmosphere may include air, nitrogen, argon, helium, other inert gas, or noble gas.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:

1. A method, comprising:
performing an additive manufacturing print cycle by:
dispensing, by a powder dispensing assembly, a plurality of layers of a powdered material onto a build platform to form a powder bed;
forming, by an energy patterning system, a first part of the powdered material on a first portion of the build platform and a second part of the powdered material on a second portion of the build platform that is different from the first portion; and
separating, by one or more components of the build platform, at least some of the first part of the powdered material from the first portion of the build platform;
verifying, by an ingester system, that the powdered material is licensed powder material; and
collecting the powdered material for reuse after the additive manufacturing print cycle.

2. The method of claim 1, wherein the separating of the third part from the first portion of the build platform further comprises dislodging lingering powders of the powdered material on the build platform by vacuuming or gas-jetting.

3. The method of claim 1, further comprising collecting the third part in the hopper having one or more sloped walls to facilitate gravitational movement of the third part, and wherein the hopper is located below the build platform.

4. The method of claim 3, wherein collecting the third part in the hopper comprises removing from the powder bed one or more integral objects formed by bonding of the powdered material.

5. The method of claim 3, further comprising transporting the third part from the hopper to a storage utilizing at least one of:
an auger;
a vacuum; and
a conveyer.

6. The method of claim 1, wherein the build platform is in a closed environment filled with an inert gas, the inert gas comprising nitrogen, carbon dioxide, helium, or argon.

* * * * *